US010151304B2

(12) United States Patent
Felton et al.

(10) Patent No.: US 10,151,304 B2
(45) Date of Patent: Dec. 11, 2018

(54) SELF-FOLDING MACHINES

(71) Applicants: President and Fellows of Harvard College, Cambridge, MA (US); Massachusetts Institute of Technology, Cambridge, MA (US)

(72) Inventors: Samuel M. Felton, Somerville, MA (US); Robert J. Wood, Cambridge, MA (US); Michael T. Tolley, San Diego, CA (US); Erik D. Demaine, Cambridge, MA (US); Daniela Rus, Weston, MA (US)

(73) Assignees: President and Fellows of Harvard College, Cambridge, MA (US); Massachusetts Institute of Technology, Cambridge, MA (US)

( * ) Notice: Subject to any disclaimer, the term of this patent is extended or adjusted under 35 U.S.C. 154(b) by 544 days.

(21) Appl. No.: 14/819,855

(22) Filed: Aug. 6, 2015

(65) Prior Publication Data

US 2016/0040657 A1 Feb. 11, 2016

Related U.S. Application Data

(60) Provisional application No. 62/034,296, filed on Aug. 7, 2014.

(51) Int. Cl.
*F03G 7/06* (2006.01)
*B32B 7/02* (2006.01)
(Continued)

(52) U.S. Cl.
CPC .............. *F03G 7/065* (2013.01); *B32B 3/266* (2013.01); *B32B 5/024* (2013.01); *B32B 7/02* (2013.01);
(Continued)

(58) Field of Classification Search
CPC ........... B32B 3/266; B32B 7/02; B32B 7/045; F03G 7/065; H01L 41/0953; H01L 41/096; H01L 41/0966; Y10T 16/548
See application file for complete search history.

(56) References Cited

U.S. PATENT DOCUMENTS 8,834,666 B2 9/2014 Sreetharan et al.
2004/0128948 A1* 7/2004 Killen .................. A47B 96/202 52/782.1

FOREIGN PATENT DOCUMENTS

WO 2014/043150 A1 3/2014

OTHER PUBLICATIONS

S.M.Felton, et al., "Shape Memory Composites for Self-Folding Structures," presentation presented at the 2014 Materials Research Society Spring Meeting, San Francisco, CA 21-25 (Apr. 2014).

(Continued)

*Primary Examiner* — Jonathan Matthias
(74) *Attorney, Agent, or Firm* — Modern Times Legal; Robert J. Sayre

(57) ABSTRACT

A self-folding machine comprises a laminate including a flexible layer with a first side and a second side; a first rigid layer including at least one gap laminated to the first side of the flexible layer; a second rigid layer including at least one gap laminated to the second side of the flexible layer, wherein the rigid layers are more rigid than the flexible layer; a first contractible layer laminated to the first rigid layer and extending across at least one gap in the first rigid layer; and a second contractible layer laminated to the second rigid layer and extending across at least one gap in the second rigid layer, wherein the first and second contractible layers retract to respectively create folds in the machine across gaps in the first and second rigid layers when activated.

15 Claims, 14 Drawing Sheets

14
12
16
20
18

(51) Int. Cl.

| | |
|---|---|
| ***B32B 3/26*** | (2006.01) |
| ***B32B 29/00*** | (2006.01) |
| ***B32B 27/38*** | (2006.01) |
| ***B32B 15/08*** | (2006.01) |
| ***B32B 5/02*** | (2006.01) |
| ***B32B 15/20*** | (2006.01) |
| ***B32B 27/08*** | (2006.01) |
| ***B32B 27/10*** | (2006.01) |
| ***B32B 27/20*** | (2006.01) |
| ***B32B 27/28*** | (2006.01) |
| ***B32B 27/30*** | (2006.01) |
| ***B64G 1/00*** | (2006.01) |
| *H05K 1/02* | (2006.01) |

(52) U.S. Cl.

CPC .............. *B32B 15/08* (2013.01); *B32B 15/20* (2013.01); *B32B 27/08* (2013.01); *B32B 27/10* (2013.01); *B32B 27/20* (2013.01); *B32B 27/281* (2013.01); *B32B 27/302* (2013.01); *B32B 27/38* (2013.01); *B32B 29/002* (2013.01); *B64G 1/00* (2013.01); *B32B 2262/101* (2013.01); *B32B 2307/202* (2013.01); *B32B 2457/00* (2013.01); *B32B 2457/08* (2013.01); *H05K 1/028* (2013.01); *H05K 2201/2009* (2013.01)

(56) References Cited

OTHER PUBLICATIONS

S.M.Felton, et al., "Shape Memory Composites for Self-Folding Structures," Abstract, 2014 Materials Research Society Spring Meeting, San Francisco, CA 21-25 (Apr. 2014).
S.M. Felton, et al., "Self-folding with shape memory composites at the millimeter scale," Micromechanics and Microengineering, vol. 25, No. 085004 (Jul. 14, 2015).
Xu Sun, et al., "Self-folding and Self-actuating Robots: a Pneumatic Approach," IEEE Int. Conf. on Robotics and Automation, Seattle, WA (May 2015).
S.M. Felton, et al., "Mechanically Programmed Self-Folding at the Millimeter Scale," J. Micromechanics and Microengineering (Jul. 14, 2015).
M.T. Tolley, et al., "Self-Folding Origami: Shape Memory Composites Activated by Uniform Heating," Smart Materials and Structures, vol. 23, No. 9, pp. 094006 (Aug. 11, 2014).
S.M. Felton, et al., "A method for building self-folding machines," Science, vol. 345, pp. 644-646 (Aug. 8, 2014).
B. Shin, et al., "Self-assembling Sensors for Printable Machines," IEEE Int. Conf. on Robotics and Automation, Hong Kong, CN (May 2014).
M.T. Tolley, "Self-Folding Shape Memory Laminates for Automated Fabrication," IEEE/RSJ Int. Conf. on Intelligent Robots and Systems, Tokyo, Japan (Nov. 2013).
S.M. Felton, et al., "Robot Self-Assembly by Folding: A Printed Inchworm Robot," IEEE Int. Conf. on Robotics and Automation, Karlsruhe, Germany (May 2013).
R. Pfeifer, et al., "Self-Organization, embodiment, and biologically inspired robotics," 318 Science 1088-1093 (2007).
J. Guan, et al., "Self-Folding of Three-Dimensional Hydrogel Microstructures," 109 J. Phys. Chem. 23134-37 (2005).
Y. Liu, et al., "Self-Folding of Polymer Sheets Using Local Light Absorption," 5 Soft Matter 1764-69 (Feb. 14, 2012).
Y. W. Yi, et al., "Magnetic Actuation of Hinged Microstructures," 8 J. Microelectromech. S. 10-17 (1999).
E. D. Demaine, et al., "Folding Flat Silhouettes and Wrapping Polyhedral Packages: New Results in Computational Origami," 16 Comput. Geom. 3-21 (2000).
G. Song, et al., "A Motion-Planning Approach to Folding: From Paper Craft to Protein Folding," 20 IEEE Trans. Robot. Autom. 60-71 (2000).
T. Tachi, "Origamizing Polyhedral Surfaces," 16 IEEE Trans. Vis. Comput. Graphics 298-311 (2010).
D.M. M Aukes, et al. "PopupCAD: A New Design Tool for Developing Self-Folding Devices," presented at the 2014 Materials Research Society Spring Meeting, San Francisco, CA 21-25 (Apr. 2014).
B. An, et al., "An End-to-End Approach to Making Self-Folded 3D Surface Shapes by Uniform Heating," 2014 IEEE International Conference on Robotics and Automation, Hong Kong, China (May 2014).
P. S. Sreetharan, et al., "Monolithic Fabrication of Millimeter-Scale Machines," 22 J. Micromech Microeng. 055027 (Apr. 23, 2012).
C.D. Onal, et al., "Towards Printable Robotics: Origami-Inspired Planar Fabrication of Three-Dimensional Mechanisms," 2011 IEEE International Conference on Robotics and Automation, Shanghai, China, 4608-4613 (May 2011).
T. Tachi, "Simulation of rigid origami," 4 Origami 175-187 (2009).
D.M. Aukes, et al., "An analytic framework for developing inherently-manufacturable pop-up laminate devices," 23 Smart Mater. Struct. 094013 (Aug. 11, 2014).
S. Coros, et al., "Computational design of mechanical characters," 32 ACM T. Graphic. 83 (Jul. 22, 2013).
S. Felton, et al., "Self-folding with shape memory composites," 9 Soft Matter 7688-7694 (Jun. 6, 2013).
E. Hawkes, et al., "Programmable matter by folding," 107 PNAS 12441-12445 (Jul. 13, 2010).
G. Whitesides, et al., "Self-Assembly at All Scales," 295 Science 2418-2421 (Mar. 29, 2012).

* cited by examiner

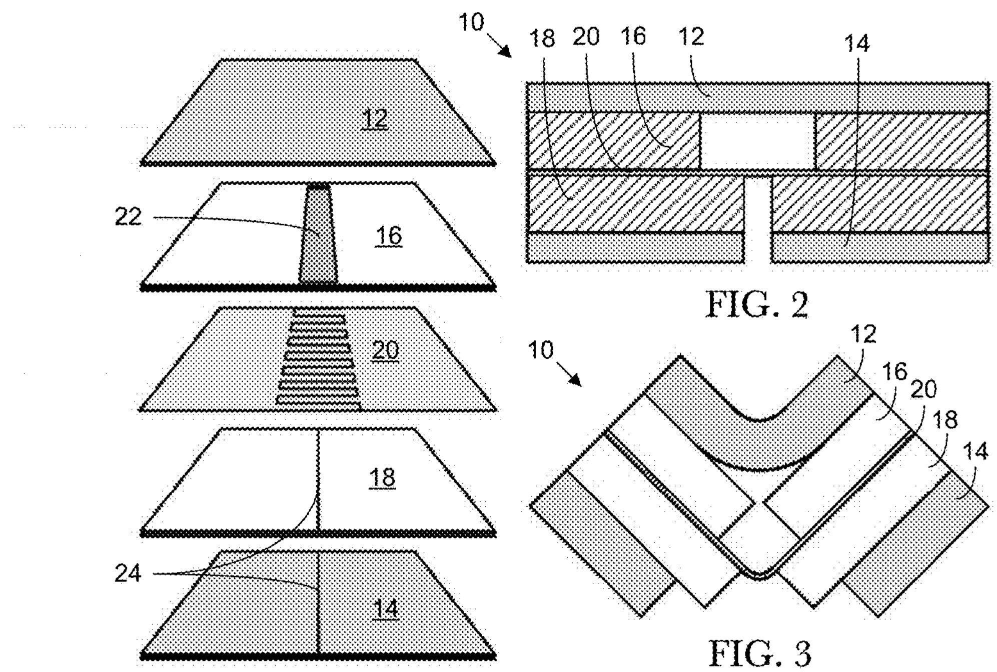
FIG. 1
FIG. 3
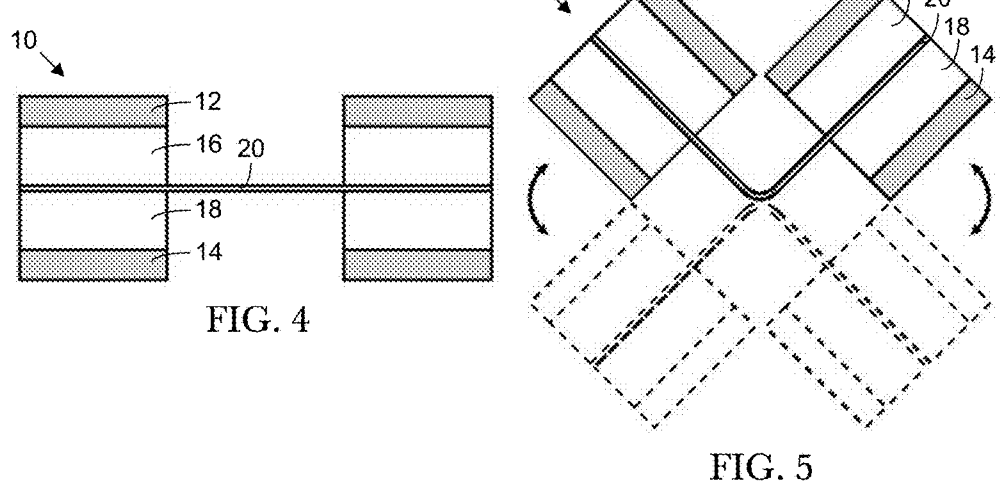
FIG. 4
FIG. 5

SELF-FOLDING MACHINES

RELATED APPLICATION

This application claims the benefit of U.S. Provisional Application No. 62/034,296, filed 7 Aug. 2014, the entire content of which is incorporated herein by reference.

GOVERNMENT SUPPORT

This invention was made with government support under Grant Nos. CCF-1138967 and EFRI-1240383 both awarded by the National Science Foundation. The Government has certain rights in the invention.

BACKGROUND

Self-assembly addresses how structures and machines can build themselves. Self-assembly is ubiquitous in nature, from cellular components to dynamically organizing insect colonies. These self-assembly concepts have many applications in engineering, as described, e.g., in R Pfeifer, et al., "Self-Organization, embodiment, and biologically inspired robotics," 318 Science 1088-1093 (2007); and several artificial methods for self-assembly have been developed at length scales ranging from nanometers to centimeters [see, e.g., G. M. Whitesides, et al., "Self-Assembly at All Scales," 295 Science 2418-2421 (2002)].

One particularly useful form of self-assembly involves folding two-dimensional materials into three-dimensional structures. Compared to other types of self-assembly, folding offers a capacity for forming complex shapes and can be scaled to different sizes. Folded structures have high strength-to-weight ratios, and planar materials are compatible with a wide range of fabrication techniques (e.g., photolithography). Prior to folding, the integration of system components (e.g., batteries, integrated circuits, motors) can be automated for planar structures with the use of pick-and-place tools used in printed circuit board population.

Several actuation methods for self-folding have been developed at a range of length scales from micrometers to centimeters, including polymer swelling [see J. Guan, et al., "Self-Folding of Three-Dimensional Hydrogel Microstructures," 109 J. Phys. Chem. 23134-37 (2005)], shape memory materials [see E. Hawkes, et al., "Programmable Matter by Folding," 107 Proc. Natl. Acad. Sci. USA 12441-45 (2010), and Y. Liu, et al., "Self-Folding of Polymer Sheets Using Local Light Absorption," 8 Soft Matter 1764-69 (2012)], and magnetic fields [see Y. W. Li, et al., "Magnetic Actuation of Hinged Microstructures," 8 J. Microelectromech. S. 10-17 (1999)].

Fold patterns can be created using existing computational origami design automation tools [see E. D. Demaine, et al., "Folding Flat Silhouettes and Wrapping Polyhedral Packages: New Results in Computational Origami," 16 Comput. Geom. 3-21 (2000); G. Song, et al., "A Motion-Planning Approach to Folding: From Paper Craft to Protein Folding," 20 IEEE Trans. Robot. Autom. 60-71 (2000); T. Tachi, "Origamizing Polyhedral Surfaces," 16 IEEE Trans. Vis. Comput. Graphics 298-311 (2010); D. M. Aukes and R. J. Wood, "PopupCAD: A New Design Tool for Developing Self-Folding Devices," presented at the 2014 Materials Research Society Spring Meeting, San Francisco, Calif. 21-25 (April 2014); and B. An, et al, "An End-to-End Approach to Making Self-Folded 3D Surface Shapes by Uniform Heating," 2014 IEEE International Conference on Robotics and Automation, Hong Kong, China (31 May-7 Jun. 2013)], and many geometries and mechanisms have been invented that harness the unique strengths of folded structures [see H. Okuzaki, et al, "A Biomorphic Origami Actuator Fabricated by Folding a Conducting Paper," 127 J. Phys. Conf. Ser. 012001 (2008); P. Birkmeyer, et al., "DASH: A dynamic 16 g Hexapedal Robot," 2009 IEEE International Conference on Intelligent Robots and Systems, St. Louis, USA, 2683-2689 (11-15 Oct. 2009); and H. C. Greenberg, et al., "Identifying Links Between Origami and Compliant Mechanisms," 2 Mech. Sci. 217-225 (2011)].

Existing approaches to self-folding are capable of creating static geometric structures but may be limited in making complex geometries or functional mechanisms (i.e., structures that move or compute). Functional folded mechanisms have been demonstrated, though they may require manual assembly steps, such as scaffold removal or integration of components after folding [see P. S. Sreetharan, et al., "Monolithic Fabrication of Millimeter-Scale Machines," 22 J. Micromech Microeng. 055027 (2012), and S. M. Felton, et al., "Robot Self-Assembly by Folding: a Printed Inchworm Robot," 2013 IEEE International Conference on Robotics and Automation, Karlsruhe, Germany, 277-282 (6-10 May 2013)].

SUMMARY

Origami can turn a sheet of paper into complex three-dimensional shapes, and similar folding techniques can produce structures and mechanisms. To demonstrate the application of these techniques to the fabrication of machines, we developed a crawling robot that folds itself. The robot starts as a flat sheet with embedded electronics and transforms autonomously into a functional machine. To accomplish this functionality, we have developed shape memory composites that fold themselves along embedded hinges. These composites can be used to recreate fundamental folded patterns, derived from computational origami, which can be extrapolated to a wide range of geometries and mechanisms. An embodiment of this self-folding robot can fold itself in four minutes and walk away without human intervention, demonstrating the potential both for complex self-folding machines and autonomous, self-controlled assembly.

A self-folding machine and a method for self-folding a machine are described herein, where various embodiments of the machine and methods may include some or all of the elements, features and steps described below.

In various embodiments, a self-folding machine comprises a flat sheet containing (a) rigid panels connected by (b) self-folding hinges that will bend themselves sequentially or simultaneously to form structures and (c) flexible hinges that can be combined with the rigid panels to produce mechanisms. These mechanisms can be driven by linear or rotary motors to produce localized motion in the rigid panels.

In particular embodiments, a self-folding machine comprises a laminate including (a) a flexible layer (e.g., a flexible polymer layer) with a first side and a second side; (b) a first rigid layer including at least one gap laminated to the first side of the flexible layer; (c) a second rigid layer including at least one gap laminated to the second side of the flexible layer, wherein the rigid layers are more rigid than the flexible layer; (d) a first contractible (e.g., shape-memory) layer laminated to the first rigid layer and extending across at least one gap in the first rigid layer; and (e) a second contractible (e.g., shape-memory) layer laminated to the second rigid layer and extending across at least one gap in the second rigid layer, wherein the first and second contractible layers are configured to retract upon actuation to respectively create folds in the machine across gaps in the first and second rigid layers when actuated.

In particular embodiments, the laminate further comprises electrically conductive pathways (e.g., circuit traces formed of copper or a composition with an electrical conductivity at least half as great as that of copper) electrically coupled with the first shape-memory layer and with the second shape-memory layer; the machine can also include a voltage source (e.g., a battery) that is also electrically coupled to the electrically conductive pathways. Further still, the machine can also include at least one motor coupled to the voltage source and including a mechanical actuator (e.g., a crank arm). Additionally, gaps can be defined in at least one of the rigid layers, and the gaps can be configured to fold the laminate to position a portion of the laminate structure to be displaced by the mechanical actuator, which may be, e.g., linear or rotar, of the motor. The laminate structure can also include a plurality of legs that are configured to be displaced by the actuator to transport the machine across a surface.

In additional embodiments, the electrically conductive pathways are contained in or on the flexible layer. Moreover, in particular embodiments, at least one of the shape-memory layers includes a shape memory polymer, such as pre-stretched polystyrene. In additional embodiments, the rigid layer comprises paper.

Further still, slits or additional gaps can be defined in each of the first and second rigid layers, wherein the first shape-memory layer does not extend over the slits or additional gaps in the first rigid layer. The second shape-memory layer does not extend over the slits or gaps in the second rigid layer, and the slits or additional gaps in the first rigid layer are aligned with gaps in the second rigid layer on an opposite side of the flexible layer. Further, the slits or additional gaps in the second rigid layer are aligned with gaps in the first rigid layer on an opposite side of the flexible layer.

In a method for self-folding the machine, the first and second contractible (e.g., shape-memory) layers are actuated to contract and fold the machine into a transformed three-dimensional structure. In particular embodiments, the laminated layers are folded by retracting at least one of the first and second shape memory layers to couple a portion of the machine with an actuator and displacing the coupled portion of the machine via actuation of the actuator. In additional embodiments, a voltage is delivered from a voltage source in the machine through electrically conductive pathways to the first and second shape-memory layers to fold the machine.

In particular examples, the self-folding apparatus and methods described herein can be used in the following two general categories of applications. The first is in the assembly of structures that are difficult to reach and manipulate. Examples include self-folding inside the body, in space, or at sizes that are too small for manual manipulation. The second application is to speed up and parallelize foldable structures. For example, a manually folded robot can take up to one hour to fold by hand. A similarly sized self-folding robot can fold itself in approximately five minutes.

The self-folding technique presented here demonstrates a way to automate the assembly of structures and machines. This technique is appropriate for features, e.g., from 0.5 to 40 mm long and is compatible with different materials and activation methods. The process can be performed relatively inexpensively and quickly. For uniformly activated hinges, the only significant piece of equipment that may be needed is a laser cutter with an appropriate resolution. For mass production, the cutting step can be replaced with stamping. Resistively activated hinges also utilize means to fabricate the trace, but the trace can be formed without using a clean room or any hazardous materials. The resulting hinges can achieve a fold angle up to 159°.

BRIEF DESCRIPTION OF THE DRAWINGS

FIG. 1 is an exploded view showing the layers of a self-folding shape-memory composite, including two outer layers of PSPS 12 and 14, two layers of paper 16 and 18, and a layer of polyimide 20 bearing a copper circuit.

FIG. 2 shows a sectional view of a structural hinge designed to fold once when activated and then become static.

FIG. 3 shows the activated PSPS 12 on the concave side pulling the two faces together, bending the polyimide along the hinge.

FIGS. 4 and 5 show a dynamic hinge designed to bend freely and repeatedly.

Figure 6:
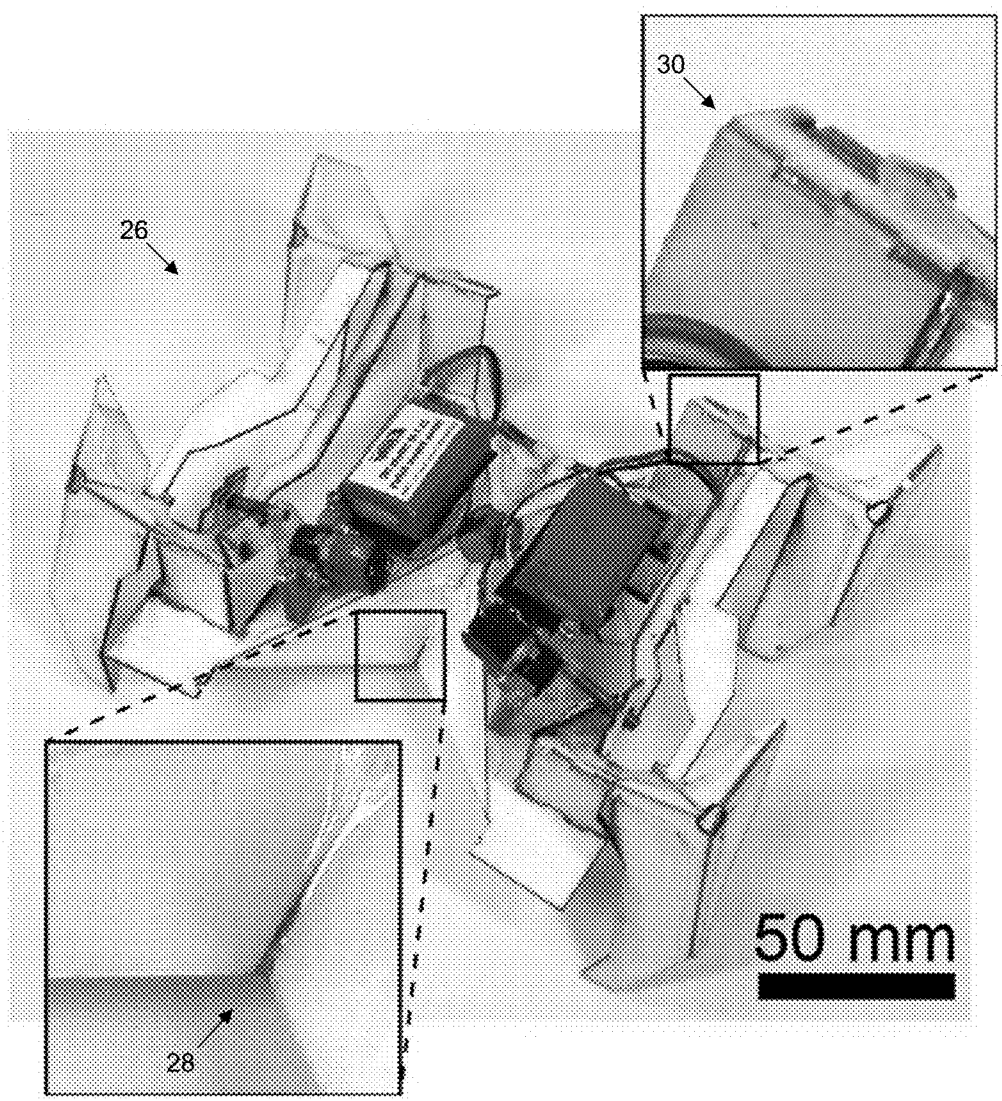
FIG. 6 shows a self-folding crawler robot 26 built with a shape-memory composite with magnified inserts showing self-folding (lower left) and dynamic (upper right) hinges.

In the accompanying drawings, like reference characters refer to the same or similar parts throughout the different views; and apostrophes are used to differentiate multiple instances of the same or similar items sharing the same reference numeral. The drawings are not necessarily to scale; instead, an emphasis is placed upon illustrating particular principles in the exemplifications discussed below.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%) can be understood as being within the scope of the description; likewise, if a particular shape is referenced, the shape is intended to include imperfect variations from ideal shapes, e.g., due to manufacturing tolerances. Percentages or concentrations expressed herein can represent either by weight or by volume. Processes, procedures and phenomena described below can occur at ambient pressure (e.g., about 50-120 kPa—for example, about 90-110 kPa) and temperature (e.g., −20 to 50° C.—for example, about 10-35° C.) unless otherwise specified.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Additionally, the various components identified herein can be provided in an assembled and finished form; or some or all of the components can be packaged together and marketed as a kit with instructions (e.g., in written, video or audio form) for assembly and/or modification by a customer to produce a finished product.

At least two primary application areas exist for a practical and sophisticated self-folding method. The first is remote, autonomous assembly. Structures and machines can be transported in a flat conformation, such as when putting satellites into space or when rapidly deploying shelters in dangerous environments (e.g., on a battlefield or in an environment posing other human health risks); and the self-assembly structure can self-fold from its flat conformation after delivery, e.g., into space or to the dangerous environment. The second application is automating aspects of manufacturing. In particular, self-folding can be combined with inexpensive planar-fabrication techniques, such as lithography, laser-machining, and pick-and-place electrical component assembly machines, to quickly produce machines from digital plans, allowing for 'printable' manufacturing (i.e., rapidly built construction with minimal overhead) to complement or compete with 3-D printing, including the ability to create monolithic electromechanical systems [see C. D. Onal, et al., "Towards Printable Robotics: Origami-Inspired Planar Fabrication of Three-Dimensional Mechanisms," 2011 IEEE International Conference on Robotics and Automation, Shanghai, China, 4608-4613 (9-13 May 2011)].

The exemplification, described below, demonstrates that autonomous self-assembly of functional machines from flat sheets is possible with a composite that folds itself. Specifically, this composite has been used to build a self-folding crawling robot that represents both a complex structure and a functional device to demonstrate the following three capabilities of the composite: (1) producing complex shapes, (2) producing dynamic mechanisms, and (3) assembling autonomously. The composite includes self-folding hinges that are controlled by embedded heating elements. The placement of these hinges in the composite and the order in which they are triggered create a fold pattern that determines the final shape of the 3-D structure or mechanism.

This embodiment of the self-folding composite combines a contractile layer of pre-stretched polystyrene (PSPS) and a passive paper substrate resulting in a bimorph actuator [see S. M. Felton, et al, "Self-folding with shape memory composites," 9 Soft Matter 7688-7694 (2013)]. PSPS is a shape memory polymer (SMP) that is mechanically programmed to bi-directionally contract when heated to approximately 100° C.; and the PSPS 12 and 14 is included on both sides of the composite bimorph actuator 10 to enable bi-directional folding, as shown in FIGS. 1-5.

As shown in FIG. 1, an embodiment of the self-folding shape memory composite 10 is formed of the following five layers: two outer layers of PSPS 12 and 14, two layers of paper 16 and 18, and a layer of polyimide 20 bearing a copper circuit (to form a printed circuit board) in the middle. Cutting a gap 22 into the upper paper layer 16 allows controlled folding of the polyimide and slits 24 in the bottom layers of paper 18 and PSPS 14 prevent antagonistic forces. The resulting structural hinge 10, designed to fold once when activated and then become static, is shown in FIG. 2. When activated, the PSPS layer 12 on the concave side pulls the two faces together, bending the polyimide 20 along the hinge 10, as shown in FIG. 3. Meanwhile, FIGS. 4 and 5 illustrate a dynamic hinge 10, designed to bend freely and repeatably.

Figure 28:
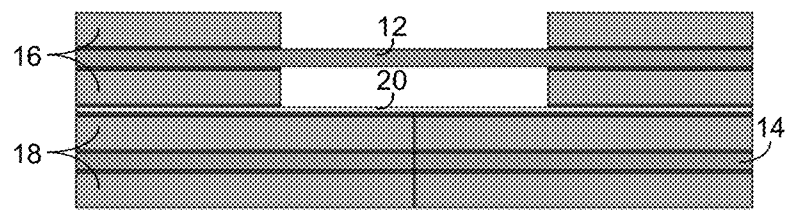
FIG. 28 is a side view of another embodiment of a self-folding composite with three functional materials in a laminated configuration of seven layers.
Figure 29:
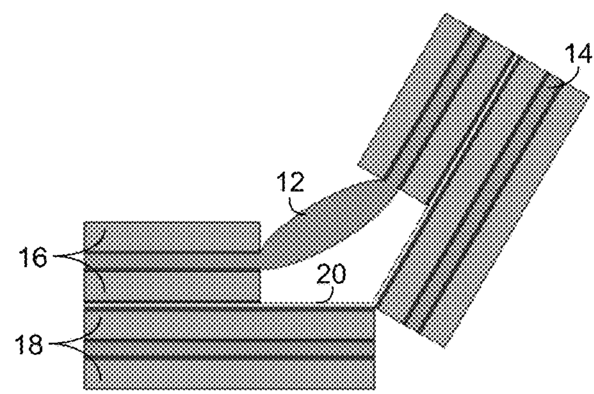
FIG. 29 shows the composite of FIG. 28 flexing with the contraction of shape-memory layer 12.

In additional embodiments, as shown in FIGS. 28 and 29, the paper layers 16 and 18 can be replaced with other "rigid" substrates, such as a glass-reinforced epoxy substrate (e.g., a FR-4 composite, which is a woven fiberglass cloth with an epoxy resin binder) or an aluminum substrate (e.g., 1145-H19 aluminum foil); and the rigid substrates 16 and 18 can be provided in pairs on each side of the flexible layer 20, such that contractible layer 12 is sandwiched between a first set of rigid layers 16 and such that contractible layer 14 is sandwiched between a second set of rigid layers 18.

The flexural layer 20 (formed, e.g., of polyimide, such as a 440 polyimide film from Chemplex Industries, Inc., of Palm City, Fla.) can be 7.5 μm thick. The contractible shape-memory layers 12 and 14 can also formed, e.g., of a polyolefin, such as DU-POF-1000-8 shrink film from U.S. Packaging and Wrapping LLC of Cabot, Ark. In the embodiment of FIGS. 28 and 29, the contractible layers 12 and 14 are each sandwiched between two rigid substrate layers 16 and 18; and the layers are bonded together with 5 μm-thick acrylic tape.

The rigid substrate layers 16 and 18 can be formed of any sufficiently stiff material. In particular exemplary devices, two different substrates were used. First, aluminum (1145-H19 aluminum) was used in uniformly heated structures (e.g., activated by placing the device on a heated hotplate. Second, a glass-reinforced epoxy substrate (e.g., FR-4 composite from Isola Group) was used in resistively heated structures. In both cases, the substrate was 50 μm thick. Aluminum was chosen for the uniformly heated structures because of its high stiffness and high thermal conductivity (170 W m-$K^{-1}$). This combination of high stiffness and high thermal conductivity enables the entire structure to maintain a uniform temperature even when parts of it lose contact with the hot plate used to heat it, ensuring that folding continues over the entire structure. In contrast, the fiber-reinforced epoxy composite is used in the resistively heated structures because of its low thermal conductivity (0.4 W m-K−1). When folding sequentially, insulation is inserted between adjacent folds to prevent the heat from one hinge from prematurely activating another. The hinges can have a gap width of, e.g., 400 μm and, when using aluminum substrate layers, can be activated by heating the device on a hot plate set to 130° C. In alternative embodiments, another heat source (e.g., an oven) can be used to heat the device to achieve activation.

As shown in FIG. 3, when the contractile layer 12 is activated, it exerts a shear stress on the substrate, causing the composite 10 to fold. These materials were chosen for their low cost and ease of use; substituting other shape memory materials or substrates into the composite 10 would be straight forward. Embedded resistive circuits are included at each hinge as heating elements to enable localized heating and activation of PSPS layers 12 and 14. Once folding is completed, the hinge is cooled, and the PSPS 12 and 14 hardens, resulting in a static fold. Self-folding hinges (as shown in FIGS. 2 and 3) are programmed into the composite 10 with layer-specific features. Passive flexures (as shown in FIGS. 4 and 5) for dynamic mechanisms are programmed in a similar manner, as discussed in the Supplemental Discussion, infra. Not only are flexure joints compatible with folded assembly, but they can also offer operational advantages over typical bearing joints, such as negligible friction losses and monolithic construction.

A self-folding crawler 26 built with the shape memory composite is shown in the photographic image of FIG. 6. This robot 26 includes both self-folding hinges 28, as shown in the magnified call-out at lower left, and dynamic hinges 30, as shown in the magnified call-out at upper right. The scale of the device can be seen in comparison with the 50 mm reference bar at lower right.

A first capability of the foldable composite structure is producing complex geometries. Folding arbitrary geometries from a single sheet of paper is mathematically possible, as discussed in the Supplemental Discussion, infra. In particular, the ORIGAMIZER program [T. Tachi, "Origamizing Polyhedral Surfaces," 16 IEE Trans. Vis. Comput. Graphics 298-311 (2010)] is a practical approach to design automation and is implemented as free software available at <http://www.tsg.ne.jp/TT/software/>. To apply this algorithm to self-folding, we demonstrated the following two fundamental features of the composite: (1) the ability to fold a crease by an arbitrary angle in a desired direction, up to 180°, and (2) the ability for these creases to be connected in any cyclic fold—e.g., a collection of creases radiating outward from a point or area.

Previous work in shape memory composites has already demonstrated folding of controlled angles of up to 135° [see S. M. Felton, et al., "Self-Folding with Shape Memory Composites," 9 Soft Matter 7688-7694 (2013), and M. T. Tolley, et al., "Self-Folding Shape Memory Laminates for Automated Fabrication," 2013 IEEE International Conference on Intelligent Robots and Systems, Tokyo, Japan, 4931-4936 (3-8 Nov. 2013)] and angles up to 180° have been approximated using two adjacent folds [see B. Shin, et al., "Self-Assembling Sensors for Printable Machines," 2014 IEEE International Conference on Robotics and Automation, Karlsruhe, Germany (31 May-7 Jun. 2014)].

Figure 7:
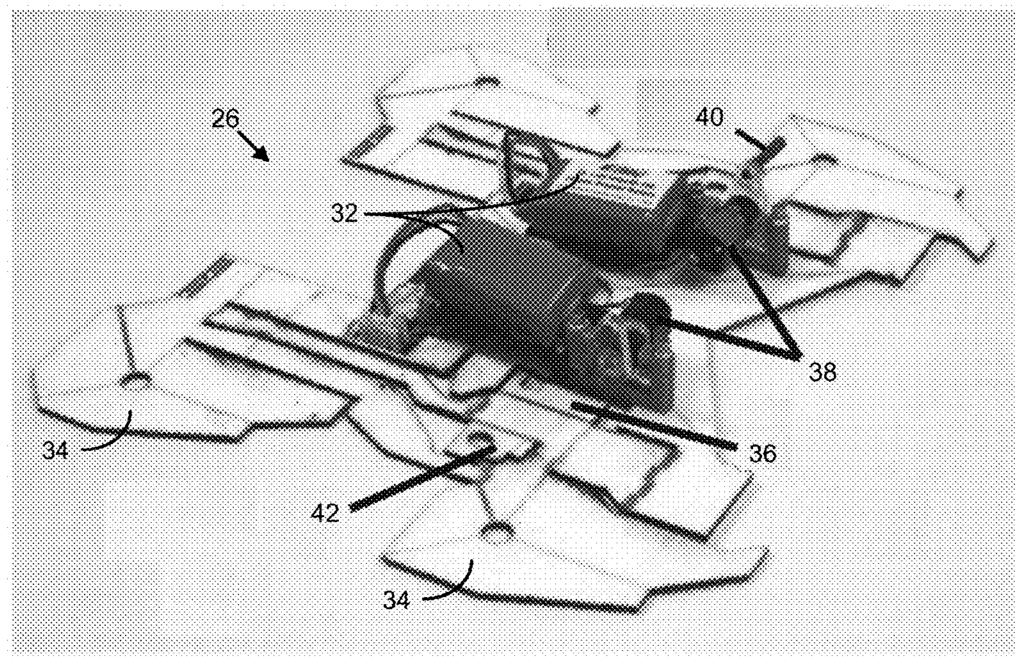
FIGS. 7, 8, 10, 11, 13 and 14 show self-assembly steps of the robot of FIG. 6.
Figure 8:
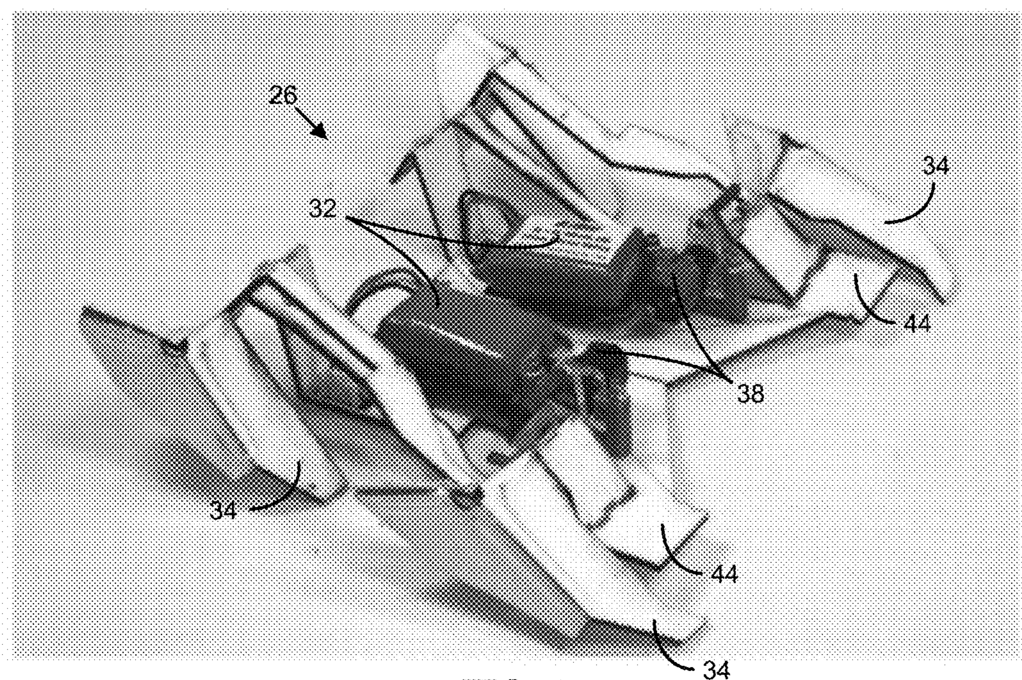
Figure 9:
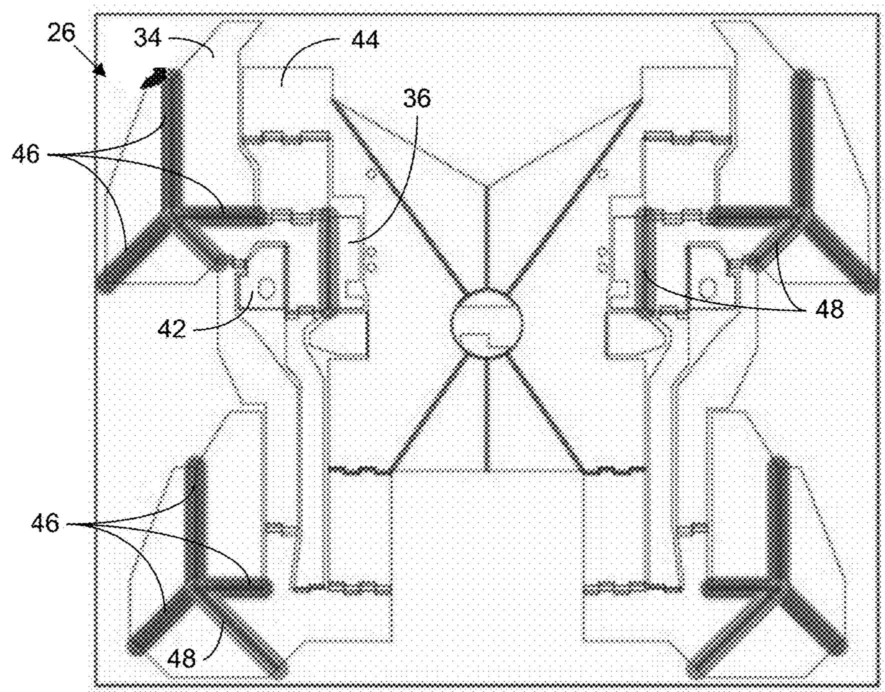
FIG. 9 shows the fold pattern and active hinges in the transition from FIG. 7 to FIG. 8.
Figure 10:
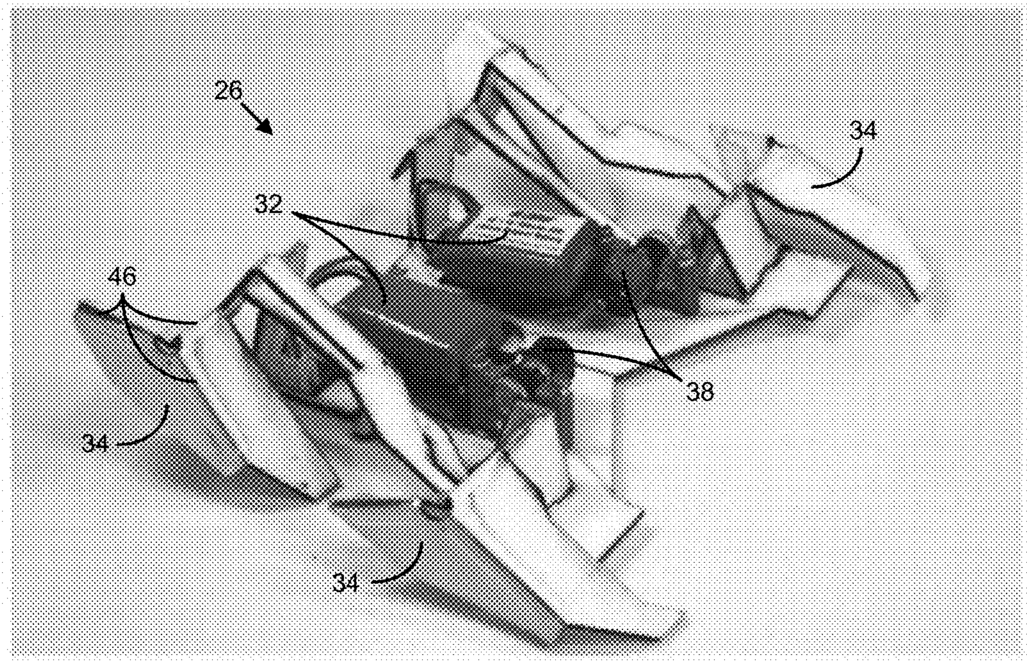
Figure 11:
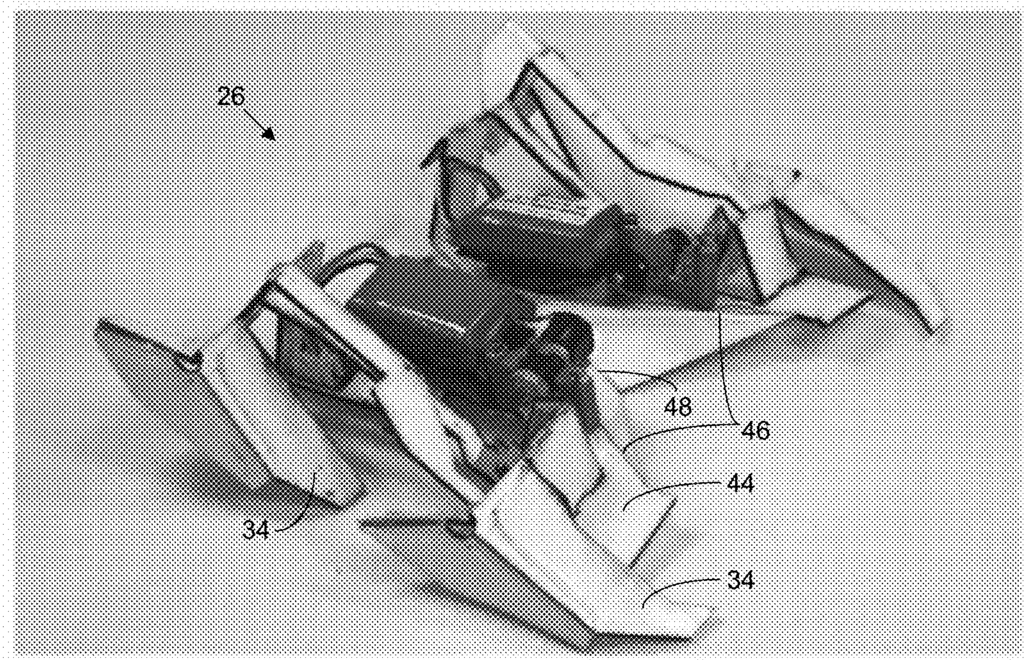
Figure 12:
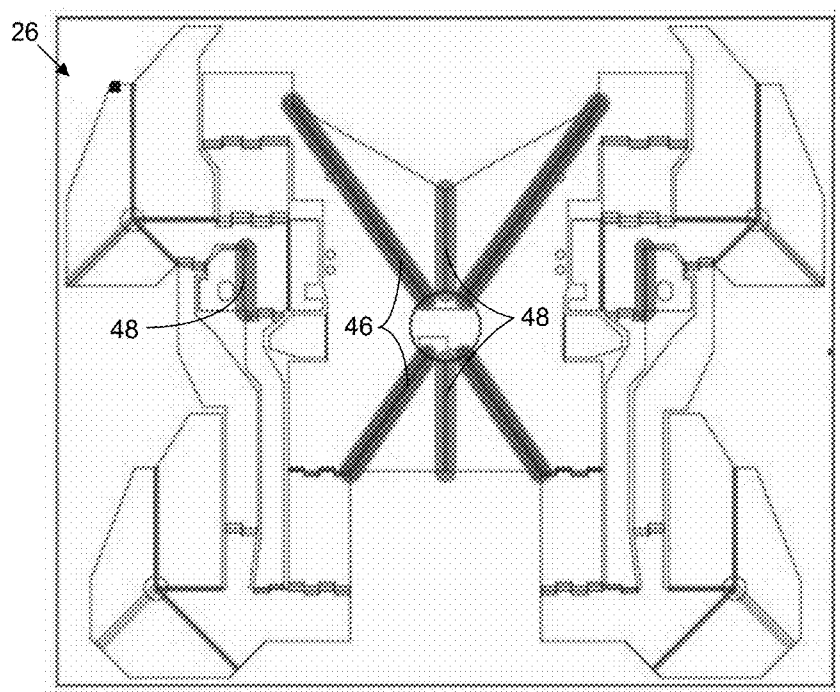
FIG. 12 shows the fold pattern and active hinges in the transition from FIG. 10 to FIG. 11.
Figure 13:
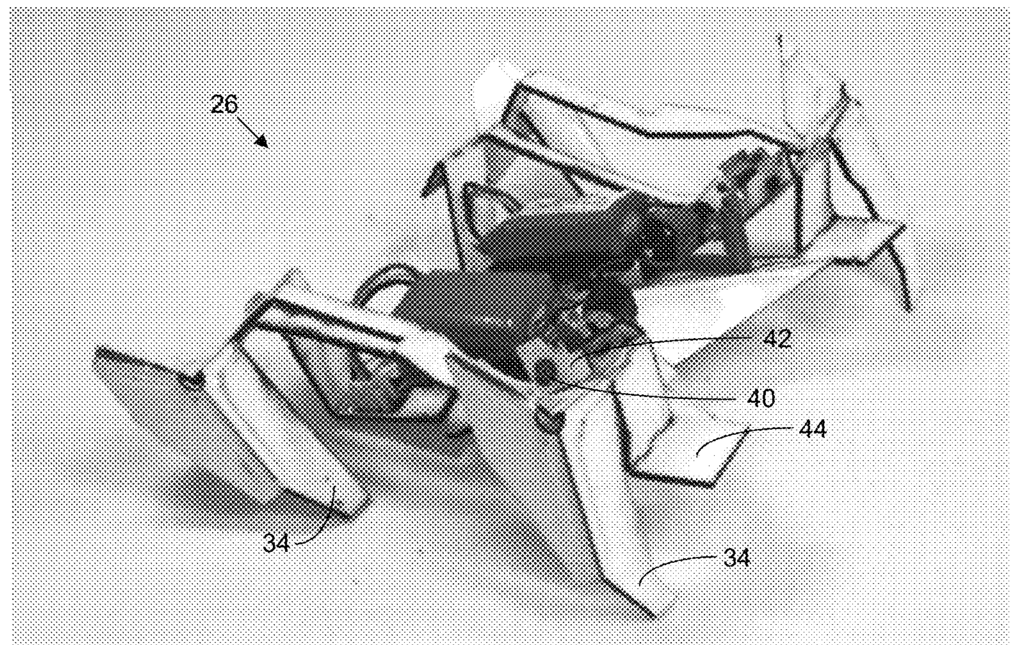
Figure 14:
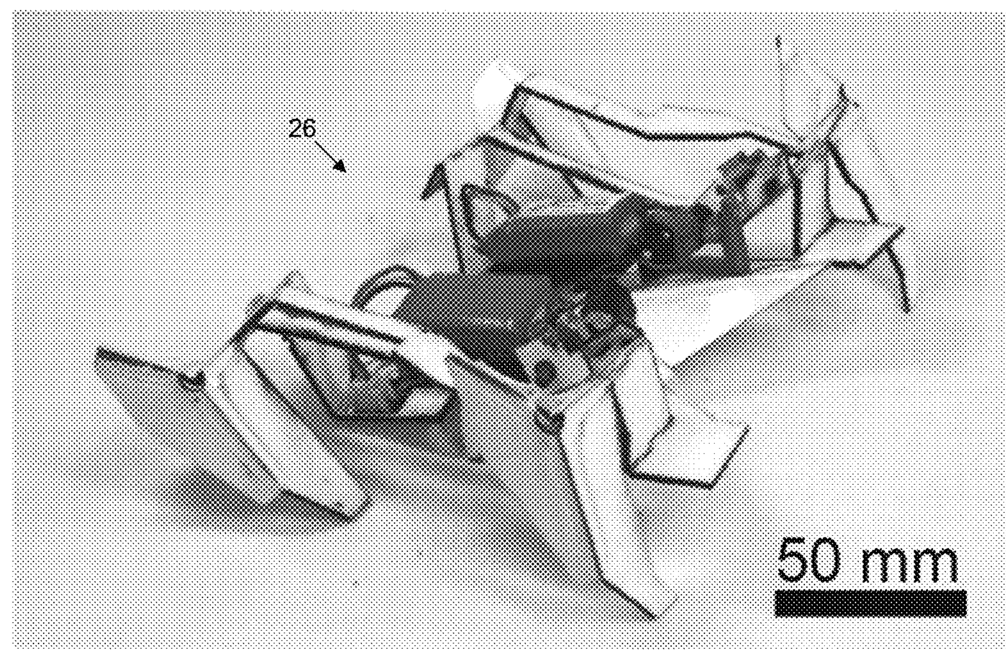
Figure 15:
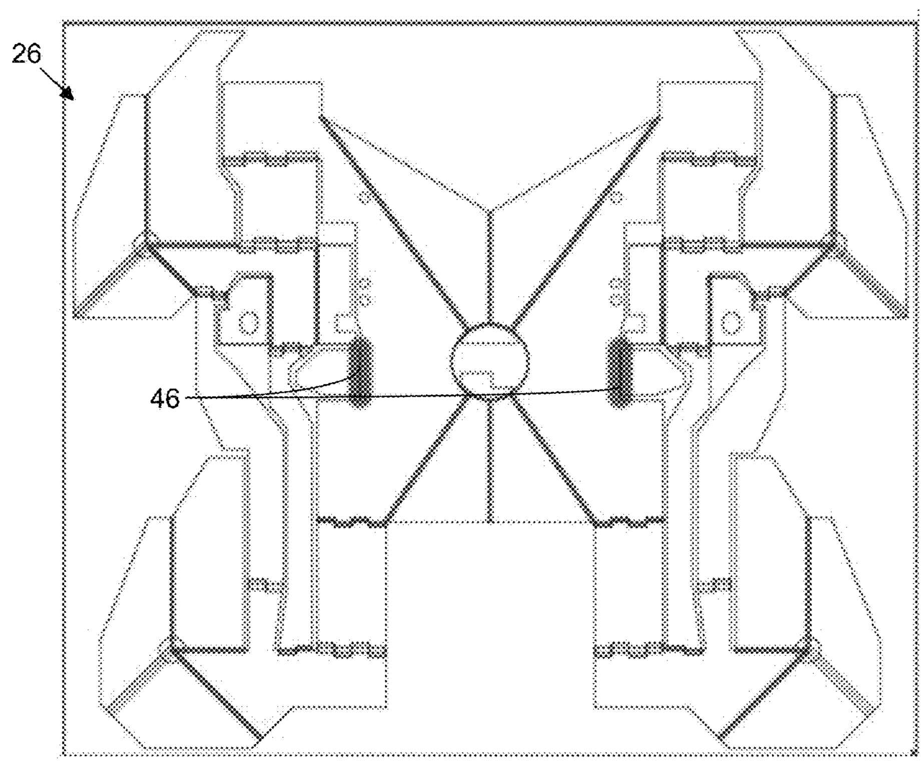
FIG. 15 shows the fold pattern and active hinges in the transition from FIG. 13 to FIG. 14.

The fold angle can be controlled by varying the gap width of the paper substrate at the hinge. The substrate acts as a mechanical stop; and a greater gap allows for a larger fold angle, as is further discussed in the Supplemental Discussion, infra. As shown in FIGS. 7 and 8, standalone hinges with square faces were built with varying paper gap widths to demonstrate that fold angles can be controlled via gap width. The various stages of pop-up self-assembly are shown in FIGS. 7-12, wherein each hinge was activated and allowed to fold to completion, at which point the hinge angle was measured. The robot 26 begins in a flat conformation, as shown in FIG. 7. Folding is initiated 10 seconds after the batteries 32 are connected to the motors 38. The outer legs 34 and alignment tabs 36 fold first, as shown in FIGS. 8 and 9. FIG. 9 shows the fold pattern, including mountain folds 46 and valley folds 48, at this stage. As the legs 34 fold, they bring the linkages into position. The motors 38 rotate 180°, pushing the crank arm pins 40 into notches in the alignment tabs 36, as shown in FIG. 10. Next, the body and locking tabs 42 fold, as shown in FIGS. 11 and 12. The motors 38 turn another 180°, causing the robot 26 to stand up, as shown in FIG. 13. Smaller middle legs 44 fold down for added stability, as shown in FIGS. 14 and 15. Once the final folds 46 and 48 cool and become rigid, the robot 26 is assembled and ready for operation.

The data show that there is a positive correlation between gap width and fold angle over a range of 0° to 120°. The data also show that for a given gap width, the standard deviation of the final fold angle is 5° when the angle is less than 100°, and 8° when the angle is greater than 100°.

To demonstrate the second feature, cyclic folds 46 and 48 were included in the machine's fold pattern to create the body and the legs, as shown in FIGS. 13 and 14. These folds 46 and 48 provide stiffness and raise the robot's body while angling the legs 34 and 44 downward. Furthermore, the legs 34 and 44 are folded using a four-edge, single-vertex fold—a specific type of cyclic fold with a single degree of freedom. This fold is noteworthy because it is the component fold of the Miura pattern, a versatile fold pattern for compressing a large area into a small volume.

There is a limitation on the spatial resolution of a folded structure due to the thickness of the folded sheet. The algorithms mentioned above assume an infinitesimally thin material. Additional work led to rules and algorithms for so-called "thick origami" to account for the non-zero thickness of physical sheets, as described in T. Tachi, "Simulation of rigid origami," 4 Origami 175-187 (2009).

A second capability of this composite is the ability to produce arbitrary mechanisms. Creating bar-and-joint linkages that can trace any algebraic curve is mathematically possible [see Supplemental Discussion, infra; M. Kapovich, et al., "Universality Theorems for Configurations of Planar Linkages," 41 Topology 1051-1107 (2002); T. G. Abbott, "Generalizations of Kempe's Universality Theorem," Thesis, Massachusetts Institute of Technology (2008); and S. Coros, et al., "Computational Design of Mechanical Characters," 32 ACM T. Graphic. 83 (2013)].

Figure 16:
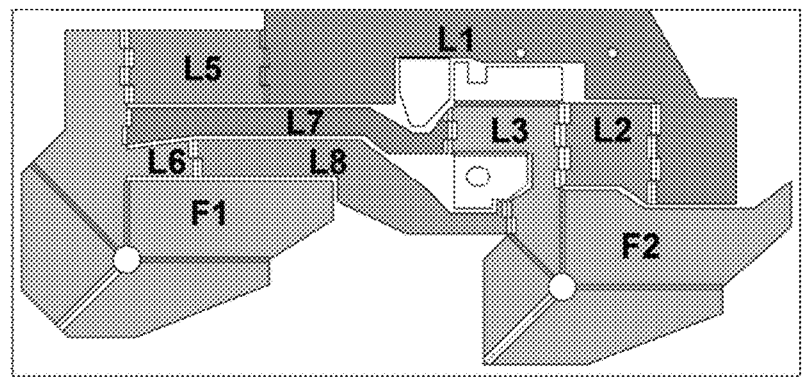
FIG. 16 shows the linkages of a self-assembly robot before the self-assembly is activated.
Figure 17:
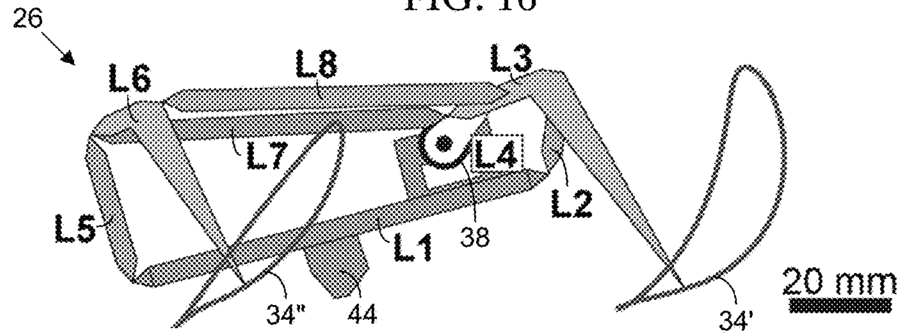
FIG. 17 shows the self-assembly robot of FIG. 16 after the linkages are coupled to the motor 38.

To apply these results to self-folding, general linkages with hinge joints were produced. This capability was demonstrated by including two symmetric eight-bar linkages in the robot's design. Each linkage assembly was driven by one motor 38 and actuated a front and back leg 34' and 34" along trajectories designed to create a walking motion, as shown in FIGS. 16 and 17. Linkages L3, L8, and L6 connect the front and back legs 34' and 34" to the motors 38 of the self-folding robot 26. The linkages are shown in FIG. 16 before self-assembly takes place, while the linkage assembly after coupling with the motor 38 is shown in FIG. 17. The front (right) leg 34' is driven by a four-bar linkage (L1-L4), and the rear (left) leg 34" is driven by an eight-bar linkage (L1-L8). The kinematics of the linkages produce walking trajectories in the front and rear feet F2 and F1 when driven by the motors 38 (shown with the red lines in FIG. 17). The middle leg 44 (extending from L1) supports the robot 26 when the outer legs 34 are raised. Linkage lengths (i.e., the long dimensions of the linkages, with other linkages typically joined toward or at the ends of which) are given in Table 1, below.

TABLE 1

| Linkage | Length (mm) |
|---|---|
| L1 | 85 |
| L2 | 20 |
| L3 | 24.5 |
| L4 | 10 |
| L5 | 30 |
| L6 | 15 |
| L7 | 68.5 |
| L8 | 70.5 |
| F1 | 50 |
| F2 | 45 |

These linkages reduce the number of motors 38 required for walking while enabling differential actuation for steering. The ability to integrate motors 38 with our linkages is also demonstrated through alignment and locking tabs 36 and 42 that couple the linkages to the motor crank arms, as shown in FIGS. 21-24.

Figure 21:
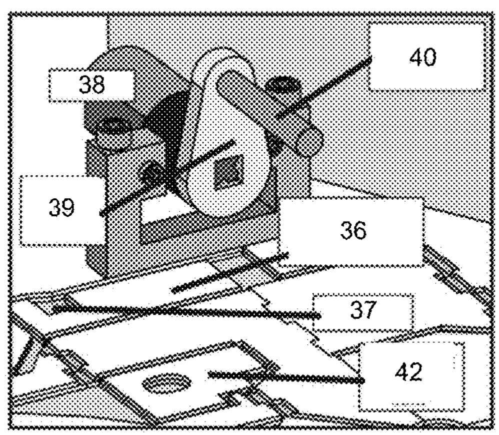
FIGS. 21-24 show the motor and alignment mechanism of the robot.
Figure 22:
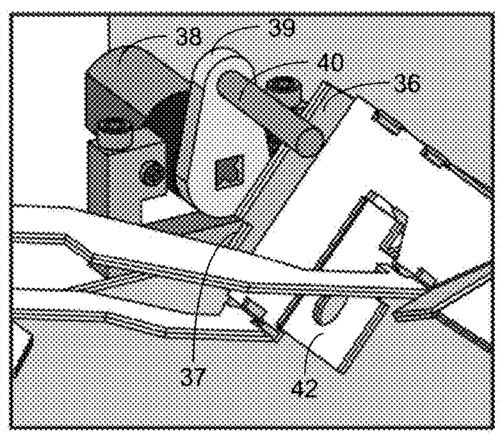
Figure 23:
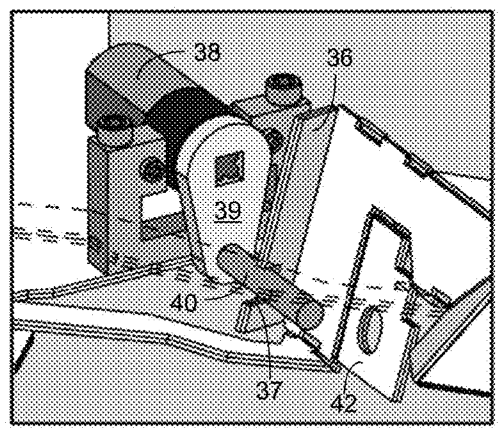
Figure 24:
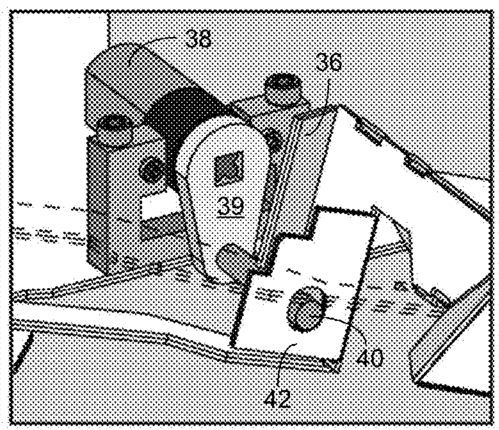

The linkages are fabricated in a plane with the composite, and the crank arms 39 are oriented upward, as shown in FIG. 21. The legs and linkages are then folded into position, and the alignment tab 36 into place, as shown in FIG. 22. The motor 38 then rotates 180°, pushing the crank arm pin 40 into the alignment notch 37, as shown in FIG. 23. The locking tab 42 then folds over the pin 40, coupling the pin 40 to the linkage, as shown in FIG. 24. In FIGS. 23 and 24, the obscuring linkage is displayed in outline only for clarity.

Figure 25:
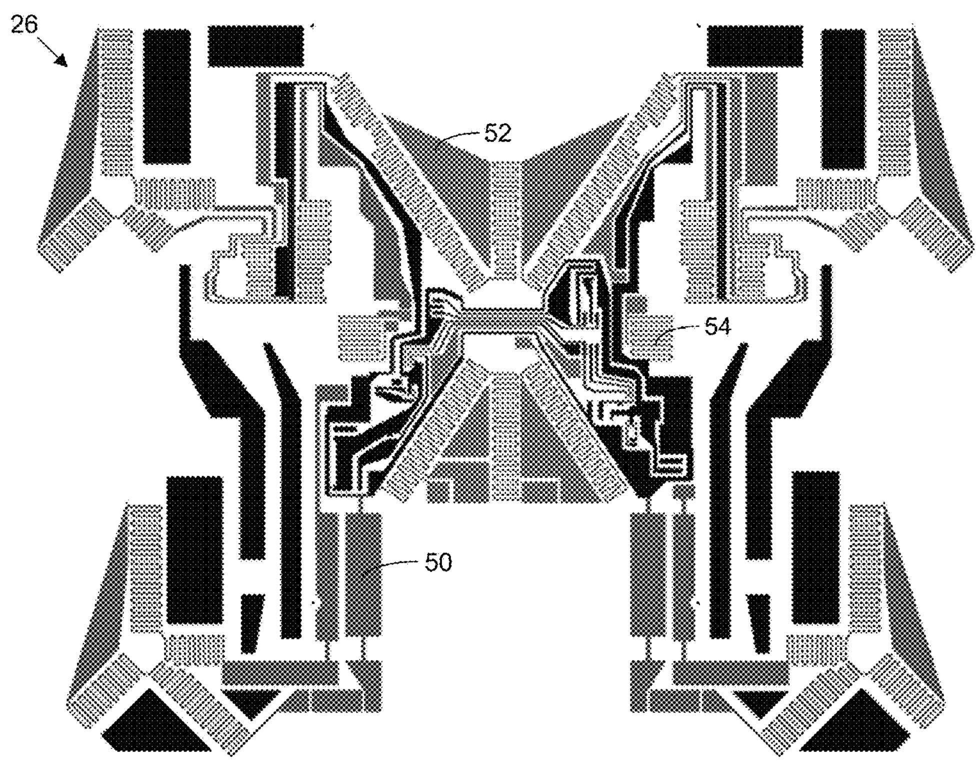
FIG. 25 shows the trace pattern of a printed circuit board (PCB) of a self-folding robot.
Figure 26:
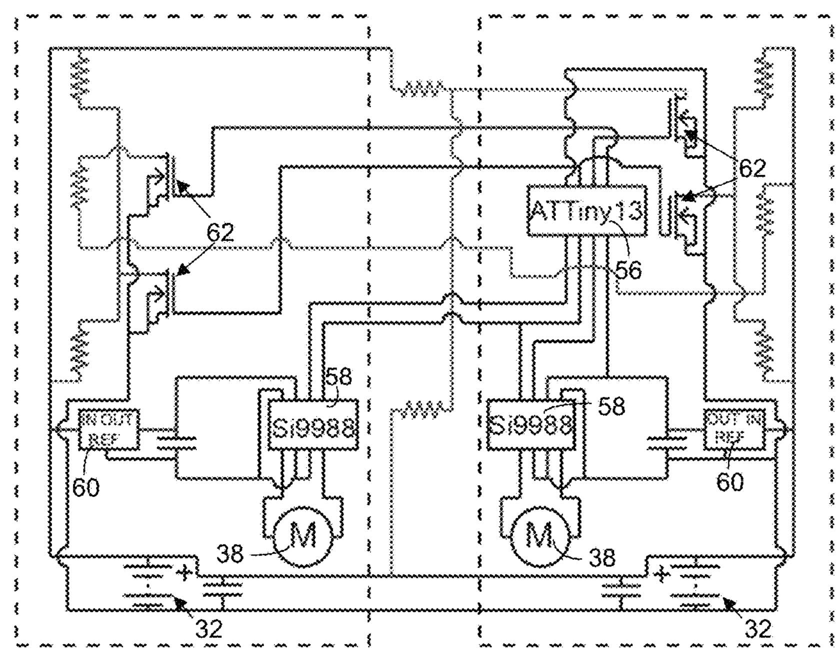
FIG. 26 shows the circuit diagram of the self-folding robot for which the trace pattern is shown in FIG. 25.
Figure 27:
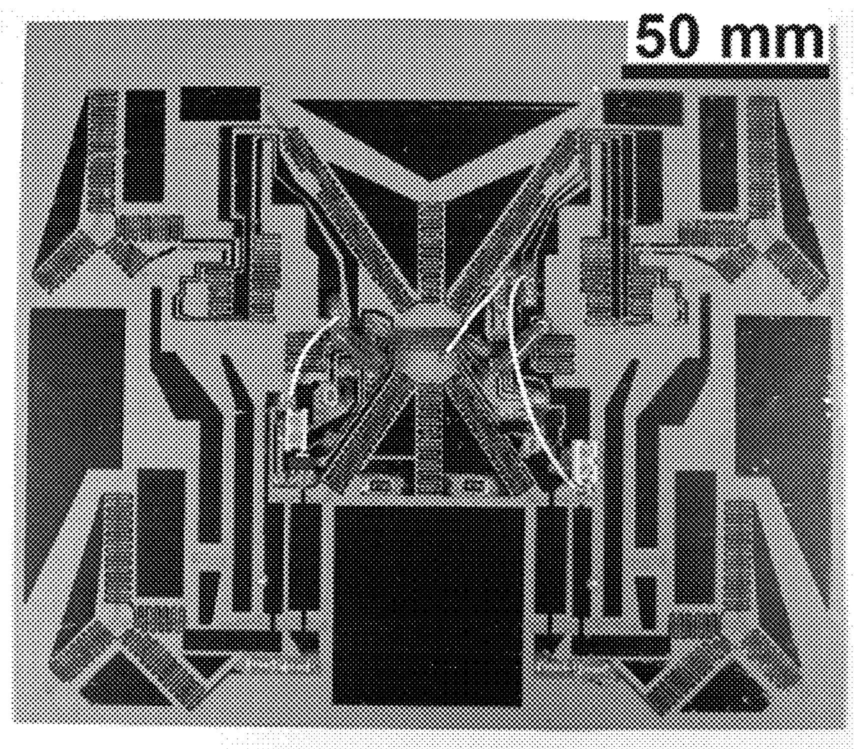
FIG. 27 shows the flexible PCB layer of the robot of FIGS. 25 and 26 with all electrical components installed.

A third capability of the composite, autonomous assembly, is demonstrated by a robot with embedded circuitry and an onboard power supply, as shown in FIGS. 25-27. This crawling machine uses a flexible printed circuit board (PCB) integrated into the laminate to control both assembly and locomotion. The trace pattern of the machine's PCB is shown in FIG. 25. Red 50, blue 52, and green 54 traces indicate the current path during activation of the first, second, and third folding steps, respectively. The machine's circuit diagram, including one microcontroller 56, two motor drivers 58, two voltage regulators 60, two motors 38, two batteries 32, and four metal-oxide-semiconductor field-effect transistors (MOSFETs) 62, is shown in FIG. 26. The flexible PCB layer of the machine, with all electrical components installed, is shown in FIG. 27. Self-assembly occurs in five sequential steps controlled by an onboard microcontroller 56. Three of these steps involve actuated folding, as shown in FIGS. 7-15.

This design was created using 2-D computer design tools, so the digital plans are compatible with many software programs and fabrication tools. The robot 26 was designed using a combination of kinematic simulations and iterative prototypes to determine a functional fold pattern. These rapid iterations were made possible by the fast fabrication process. The Supplementary Discussion, infra, includes additional design information for all components of the robot.

Fabricating the 2-D composite and installing the electrical components took two hours by hand. The quickness of this fabrication process is possible in part because the composite is essentially two-dimensional, allowing for easy installation and soldering. The process was also designed around readily available parts and materials, but the assembly time can be substantially reduced and completely automated with the use of pick-and-place electrical component assembly machines and automated adhesive dispensers.

The robot 26 self-assembled in 270 seconds; after which time, it was able to walk without further manual intervention, as shown in FIGS. 7-15. The self-assembled linkage mechanisms operated effectively, demonstrating both the efficacy of the composite's dynamic hinges and its ability to precisely align folds to couple the motors to the linkages. When operating, the robot 26 moved at a speed of 0.43 body lengths per second (5.4 cm/s) and was able to turn at an average speed of 0.56 rad/s with an average turning radius of 6.1 cm. The folding process used approximately 8.8 kJ of electrical energy to activate, as discussed in the Supplementary Discussion, infra.

The mechanical work employed to assemble the robot 26 was calculated to be 3.8 mJ based on the mass (78 g) and the final center of mass height (10 mm) of the robot 26. Assuming that the torque is exerted evenly by all hinges and that all hinges reach completion at 90°, then the total torque exerted by the hinges is at least 10 mNm. This total does not account for the effects of friction or antagonistic forces caused by hinges pushing against each other. Based on an analytical model relating the hinge geometry and material properties to actuated torque, the actual torque exerted by the hinges is calculated to be 150 mNm, as discussed in the Supplementary Discussion, infra.

Out of three attempted self-assemblies, one robot 26 was able to complete the assembly process and achieve the desired functionality. In the other two trials, a single hinge failed to fold to the required precision, which illustrates the interdependent nature of self-assembling machines with localized actuation and the advantages of design methodologies that produce folding plans that are robust to failures of individual folds. Considering these three trials as sets of individual hinges, 82 of 84 hinges self-folded to their intended position.

For the machine presented here, folding was initiated by a simple timing program in the microcontroller 56, designed to trigger assembly ten seconds after the batteries 32 were connected. However, more complex triggers can be integrated, including wireless activation or response to an environmental change, as discussed in the Supplementary Discussion, infra. The materials used in this robot 26 are well suited for structures and machines at a length scale of tens of centimeters (e.g., 10-100 cm), but limitations imposed by fabrication techniques and hinge torques can restrict their use for smaller and larger devices, respectively. Fortunately, these limitations can be overcome by using different materials and fabrication methods. This substrate also has a maximum operating temperature of approximately 100° C. A higher temperature causes uniform activation of the shape memory polymer, resulting in a deformed and non-functional machine. This limit can also be altered through material selection, as discussed in the Supplementary Discussion, infra.

The self-folding robot 26 demonstrates a practical process for creating self-assembling machines with complex structures and dynamics using planar materials and folding. By automating the folding process, origami-inspired machines can be produced without manual folding, reducing the skill and time necessary for fabrication. This technique can be used to rapidly prototype electromechanical systems, build satellites that assemble themselves in space, and fabricate centimeter-scale robots. Because this technique uses composites that are inexpensive and can be easily altered, this technique can be adapted to a wide range of applications.

Supplementary Discussion:

Materials and Methods

Two sheets of 250 μm thick pre-stretched polystyrene (PSPS) 12 and 14 (KSF50-C shrink film from Grafix Arts of Maple Heights, Ohio) and two sheets of 500 μm thick paper 16 and 18 (Cold Press Bright paper from Epson America, Inc., of Long Beach, Calif.) (SIB) were used in the assembly of each robot 26. The copper-polyimide layer 20 was masked using a solid ink printer (a Colorqube printer from Xerox Corporation of Norwalk, Conn.), as shown in step A of FIG. 18 and etched with ferric chloride (CE-100 copper etchant from Transene Company, Inc., of Danvers, Mass.). Each layer was machined individually with layer-specific features, as shown in step C of FIG. 18, using a $CO_2$ laser system (VLS 2.3 laser system from Universal Laser Systems of Scottsdale, Ariz.) and then bonded together with silicone tape (ARclad 7876 tape from Adhesives Research, Inc., of Glen Rock, Pa.), as shown in step D of FIG. 18. The final composite 10 was laser cut, as shown in step E of FIG. 18.

Figure 18:
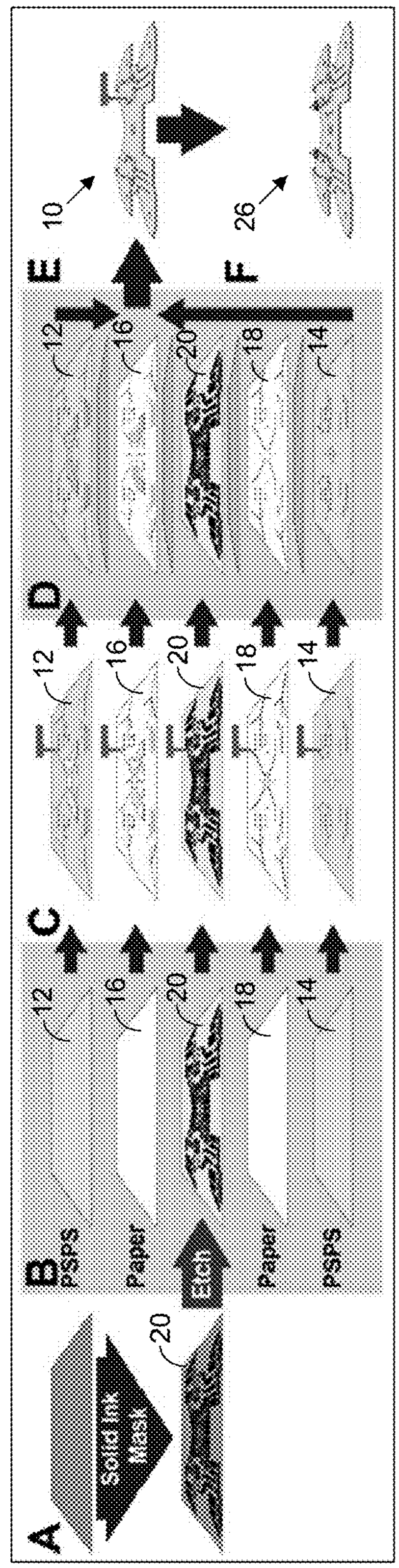
FIG. 18 shows the fabrication process of a self-folding robot.

Electrical and electromechanical components (e.g., batteries and motors) were manually installed when the robot 26 was in the flat conformation, as shown in step F of FIG. 18; alternatively, these components can be added using a pick-and-place machine.

Electrical components include a microcontroller (ATTiny13 microcontroller from Atmel Corporation of San Jose, Calif.), two buffered H-bridges (Si9988 H-bridge from Vishay Siliconix of Santa Clara, Calif.), two dual metal-oxide-semiconductor field-effect transistors (MOSFETs) (FDS6930B MOSFETs from Fairchild Semiconductor Corp. of San Jose, Calif.), two voltage regulators (AP1117 regulators from Diodes, Inc., of Plano, Tex.), two 1Ω resistors (MRA-051R000FE12 resistors from Vishay Dale of Columbus, Nebr.), two 0.75Ω resistors (RCWE2512R750FKEA resistors from Vishay Dale), four 0.5Ω resistors (LR2512-R50FW resistors from TT Electronics of Surrey, England), and four 4.7 μF capacitors (C0402C475M7PACTU capacitors from Kemet Electronics Corporation from Simpsonville, S.C.). Additional components include two 3.9 g DC motors (210-002 motors from Precision Microdrives Ltd. of London, England) and two 7.4 V, 180 mAh LiPo batteries (E-flite EFLB1802S20 batteries from Horizon Hobby, Inc., of Champaign, Ill.). Mounts for the batteries and motors were 3-D printed using an Objet30 Scholar 3D printer (from Stratasys Ltd. of Minneapolis, Minn.) and installed with screws.

Speed and turning measurements were made with digital video and analyzed using ImageJ public-domain software available from the National Institutes of Health at <http://imagej.nih.gov/ij/>. Power consumption was determined by measuring the amount of charge supplied to the batteries to recharge the batteries completely. Angle measurements of test hinges were made with a digital camera and measured with ImageJ software.

Additional Exemplary Self-Folding Structures

Figure 30:
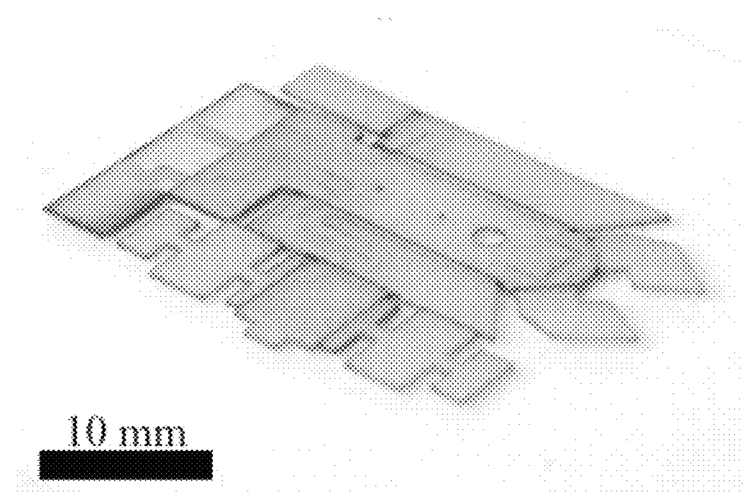
FIG. 30 is a perspective view of a flat composite programmed to fold into a ship-like structure.
Figure 31:
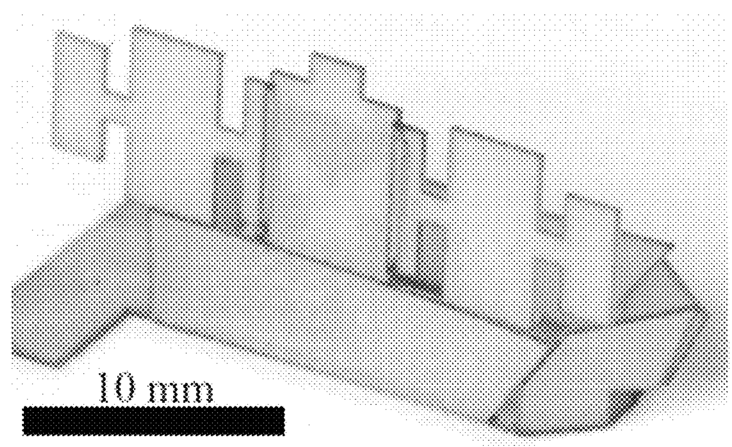
FIG. 31 shows the composite of FIG. 30 after the "hull" is folded in a first folding step.
Figure 32:
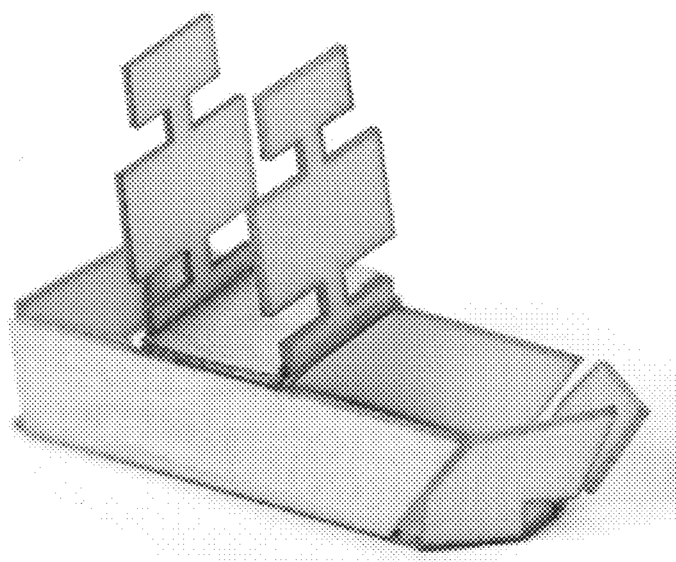
FIG. 32 shows the "ship" of FIGS. 30 and 31 after the "sails" are folded in a second folding step.

A) Ship:

A structure resembling a miniature ship, shown in FIGS. 30-32, was designed to demonstrate the complexity of a structure folded sequentially via resistive heating. This structure assembled through two sequential folding steps. The first folds created the hull of the ship and were activated with 220 mA of current. The second set raised the sails and was activated with 160 mA. Each step took approximately 20 seconds. We believe the difference in activating currents may be related to differing thermal profiles in the hinges. The hinges ranged in length from 3 to 13 mm in length, and included both mountain and valley folds.

Figure 33:
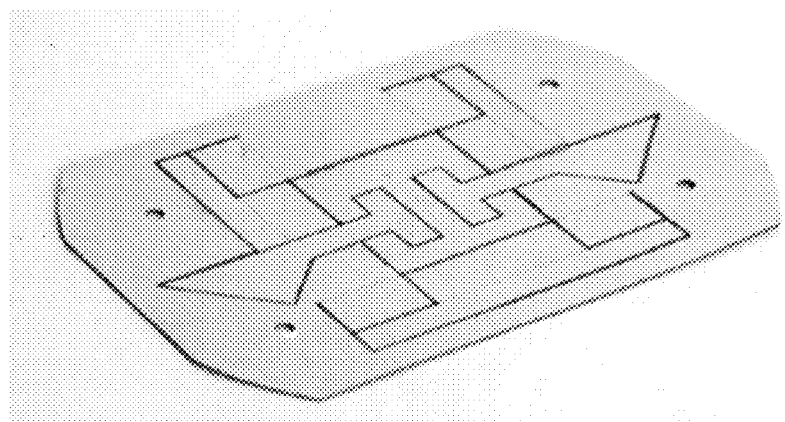
FIG. 33 is a perspective view of a flat composite programmed to fold into a bumblebee-like structure.
Figure 34:
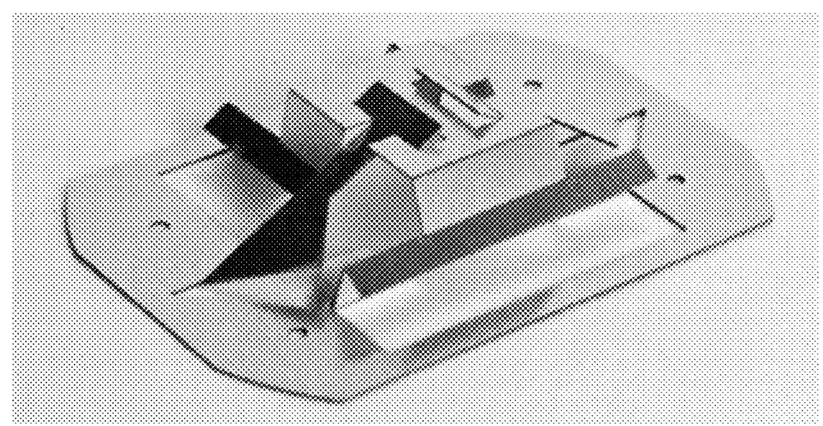
FIG. 34 shows the composite of FIG. 33 after folding.
Figure 35:
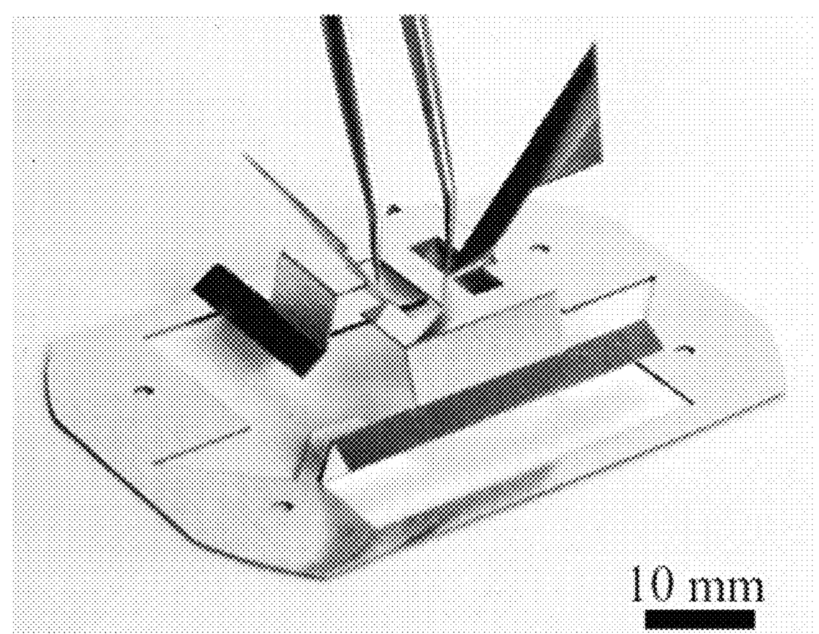
FIG. 35 shows the composite of FIGS. 33 and 34 with its "wings" raised.

B) Bumblebee:

A structure that resembled a bumblebee, shown in FIGS. 33-35, was designed and built to demonstrate that uniform folding can produce static structures and dynamic mechanisms. The bumblebee assembled during a single folding step that was activated by a hot plate set to 130° C. Assembly took eight seconds. This structure includes a self-folding Sarrus linkage that comprises the 'body' of the bee, and wings that are attached to the body via passive hinges. The wings can be actuated by pushing on tabs in the body of the bee. The Sarrus linkage is a single degree-of-freedom mechanism that allows two surfaces to move towards or away from each other while constraining them to remain parallel. This linkage is particularly significant because it can form a basis around which pop-up book MEMS devices, as described, e.g., in U.S. Pat. No. 8,834,666 B2, are designed, indicating that the self-folding technique presented here is compatible with pop-up book MEMS and can be used to actuate the assembly process. The self-folding hinges ranged in length from 8 to 15 mm in length, and included both mountain and valley folds. The passive hinges were each three millimeters long.

Supplementary Text

Composite Design:

Self-folding hinges are programmed into the composite 10 through the following features: gaps in a paper substrate 16/18 are cut on both sides to enable free bending of a polyimide layer 20, a gap is cut into a PSPS layer 14 on the convex side of the fold to prevent antagonistic forces (as shown in FIG. 2), and a serpentine resistive circuit is imprinted on the copper-polyimide layer 20 for local activation. When current is supplied to the circuit, the composite heats up, and the PSPS 12 on the concave side of the fold contracts and exerts a moment on the two faces, as shown in FIG. 3. The appropriate level of electrical current for activating the contractible layer can be determined experimentally. If the current is too low, some faces may not fold completely; and, if the current is too high, other faces may delaminate.

Figure 19:
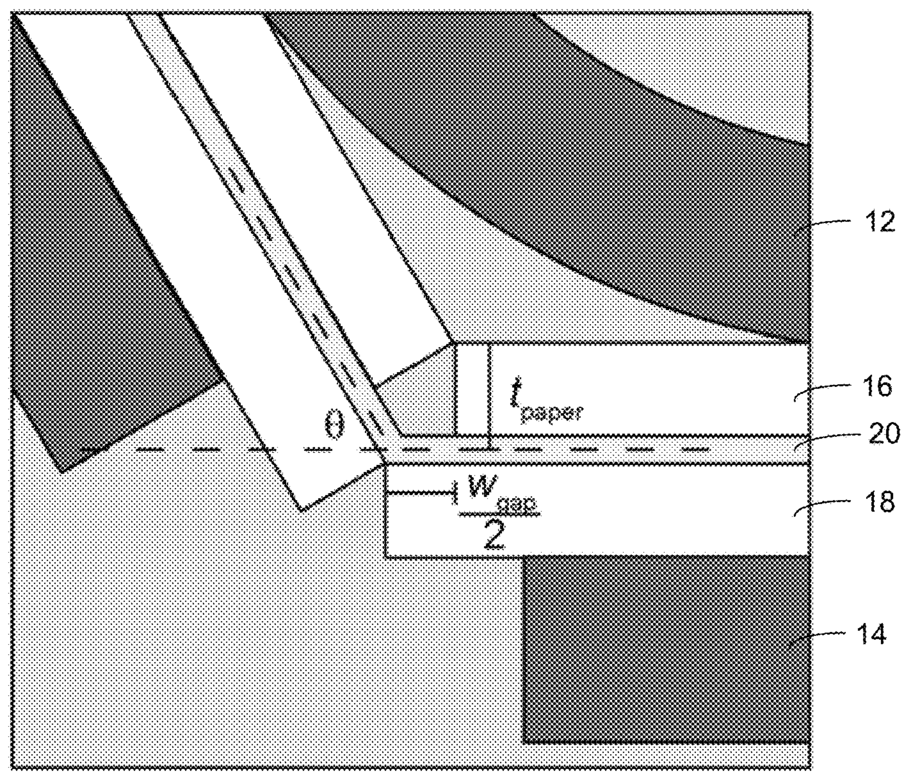
FIG. 19 shows an analytical model of the final fold angle of a hinge determined by the geometry of the hinge.
Figure 20:
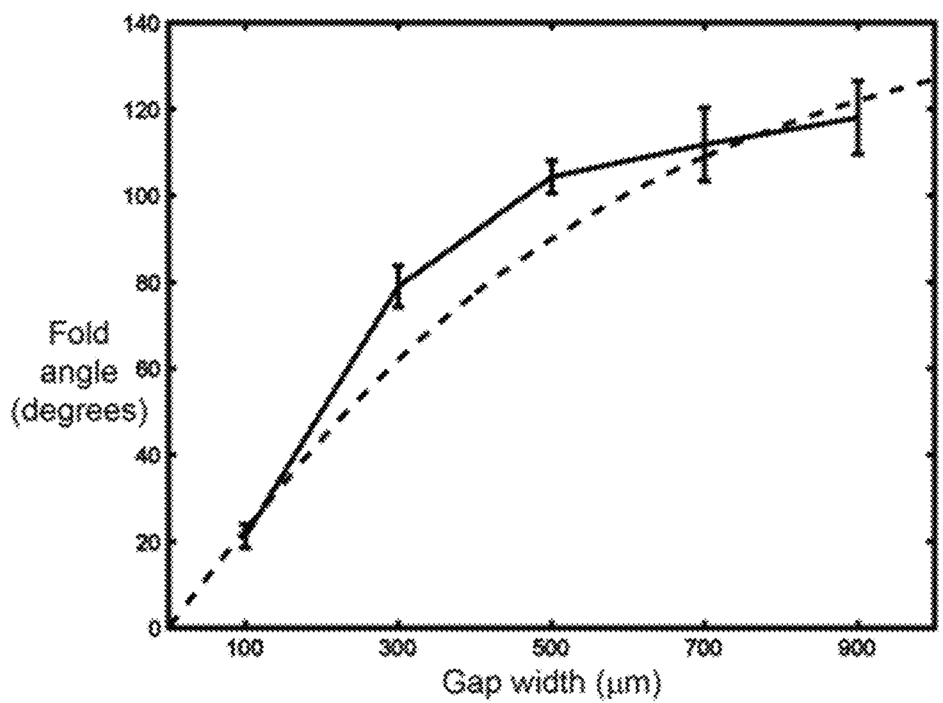
FIG. 20 plots folding of the analytical model (dashed line) along with the mean (±SD) of the measured fold angle as a function of gap width (solid line).

The final angle of the fold can be programmed by varying the width of the paper gap on the concave side. As the hinge folds, the paper 16/18 on either side of the hinge eventually comes into contact, stopping the fold from progressing. By varying the width of this gap, we can control when this stop occurs, setting the final angle of the fold. To demonstrate this control, test hinges were created that were 30-mm long and 30-mm wide to measure the relationship between hinge angle, $\theta$; gap width, $w_{gap}$; and paper thickness, $t_{paper}$. The resistive circuits were supplied with 2.5 A current for two to three minutes, until self-folding was complete. The final fold angle, $\theta$, shown in FIG. 19, is compared in FIG. 20 to an analytical model based on the geometry of the hinge, $\theta=\arctan(w_{gap}/2\ t_{paper})$. Specifically, the final fold angle is plotted as a function of gap width in the rigid layer in FIG. 20. The analytical model (dashed line) is plotted along with the mean±standard deviation of the fold angle; N=4 for each gap width. The experimental results show that the final fold angle is greater than the model predicts; we believe this is because the model assumes that the paper 16/18 is incompressible; but in reality, the corners deform under load. The maximum fold angle is limited by the shrink ratio of the PSPS layer 12—in this case, limiting the angle to approximately 120°.

Self-folding machines also require dynamic hinges for movement, and these too are programmed into the composite 10 via layer-specific features. A gap is cut into each layer of paper 16 and 28 and PSPS 12 and 14 at the hinge, so that the hinge stiffness is determined by the bending stiffness of the polyimide 20, as shown in FIGS. 4 and 5. The range of bending is determined by the gap width, and dynamic hinges that bend in only one direction can be created by cutting a slit of negligible width on the opposite side.

Algorithmic Results:

Every polyhedral complex (i.e., a union of polygons in 3-D) can be folded from a sufficiently large square of paper. Unfortunately, these original algorithms were impractical, wasting most of the material and making folds through many layers of paper. Recently, the Origamizer approach (software available from Tomohiro Tachi at <http://www.tsg.ne.jp/TT/software/>) has proven to be a practical approach to folding arbitrary polyhedra. For example, Tomohiro Tachi, the creator of the Origamizer software [see T. Tachi, "Origamizing polyhedral surfaces," 16 IEEE Trans. Vis. Comput. Graphics 298-311 (2010)], can fold a square of paper into the classic Stanford bunny 3-D model (at a resolution of 374 triangles) by hand. The algorithm can be simplified for self-folding machines because we have the luxury of arbitrarily cutting the sheet material. By cutting out the complex "vertex tucking molecules" used in the Origamizer software, the resulting foldings involve "edge tucks" (180° folds bringing two polyhedron edges together, folded to the dihedral angle in the polyhedron) connected in a group of cycles mimicking the combinatorial structure of the desired polyhedral surface (cut to reduce an arbitrary topology to a simple disk). We have demonstrated a self-folding composite that can make these types of folds using cyclic fold patterns, and we therefore expect it to practically reproduce many Origamizer-generated designs.

As an alternative to the Origamizer software, popupCAD software can be used to design the folding structure, as described in D. M. Aukes, et al., "An analytic framework for developing inherently-manufacturable pop-up laminate devices," 23 Smart Mater. Struct. 094013 (2014).

The so-called Kempe Universality Theorem states that a 2D bar-and-joint linkage can "sign your name", that is, trace any desired polynomial curve. Kempe gave a beautiful construction for this problem in 1876 but did not actually prove the theorem. The first published proof established a more general result, allowing the trace of any algebraic set defined by a system of polynomials. This proof was subsequently simplified and generalized to an asymptotically optimal algorithm for linkage construction in arbitrary dimensions. Although theoretically optimal, these algorithms still require many joints. Recently, a practical implementation has been developed that approximates a desired motion (as required by a robot, for example) by a designed linkage with very few joints [see S. Coros, et al., "Computational design of mechanical characters" 32 ACM T. Graphic. 83 (2013)]. These constructions employ universal hinges connected by rigid bars, but such constructions can be easily converted into panel-and-hinge structures; for example, we can extrude any of the 2-D constructions orthogonally into 3-D. We have demonstrated a self-folding composite that can make panel-and-hinge structures; and, therefore, we expect the self-folding composite to be capable of practically reproducing many linkage mechanism designs.

Robot Design:

Because cyclic folds can be extrapolated to produce arbitrary geometries, they were incorporated into the robot's fold pattern. The robot's body is formed with a six-hinge cyclic fold, as shown in FIG. 12, which stiffens the body and raises it from the ground, while angling the legs downward. Each leg 34 consists of a four-edge, single-vertex fold 46/48, as shown in FIG. 9, which is a type of cyclic fold with a single degree of freedom. The fold 46/48 provides rigidity to the legs 34 and also aids in the formation of the linkages. Because this fold 46/48 has a single degree of freedom, the redundant actuation of the folds 46/48 increases the effective force of the folding, which pulls the linkage system into position.

The dynamic capabilities of this self-assembly method are demonstrated by the walking motion of the robot 26, driven by a motor 38 on each side. Each motor 38 drives a front and back leg 34, as shown in FIG. 17, through an eight-bar linkage. The purpose of the linkage is to transform the cyclic motion of the motor 38 into an approximately cyclic trajectory in each foot F1/F2 to mimic a walking motion. Linkage lengths are given in Table 1, above.

In addition to the desired foot trajectory, there are other considerations when designing linkages for folded machines. The linkage design is constrained so that the lengths sum to zero. This constraint ensures that the linkages can lie in a flat conformation prior to folding and that the linkages do not have to change length during assembly (see FIG. 16). While this method can be used to change the effective length of linkages during assembly, we chose not to do so in order to simplify the design. The dynamic hinges are castellated—meaning that the hinge line is staggered in a square wave pattern, as shown in the top-right call-out of FIG. 6. This hinge castellation is provided to increase the off-axis stiffness without decreasing the hinge's pivot range. However, there is still a minimum hinge width to bear a particular load. For the loads experienced by the linkages of the self-folding robot 26, this width is approximately seven millimeters. Finally, the linkage design is constrained by the torque exerted by the folding hinges during assembly. Some linkage designs may require more torque to self-assemble than the actuated folds can provide. The final linkage design for the robot was selected with these constraints in mind and using a combination of kinematic simulations and prototype testing.

These linkages also demonstrate that this assembly technique is capable of precision alignment by configuring the crank arm pin 40 to couple into a specific slot in the locking tab 42 of the linkage mechanism. This coupling is accomplished by first folding tabs 36 with an alignment notch 37 during the folding of the legs 34, as shown in FIG. 22. After the legs 34 have folded and the linkages are in position, the motors 38 rotate 180°, pushing the crank arm pin 40 into the notch 37, as shown in FIG. 23. A locking tab 42 on the far side of the linkage then folds around the pin 40, coupling it with the linkage mechanism, as shown in FIG. 24.

Two additional, static legs 44 are included in the middle of the body to provide stability, as shown in FIG. 17. The gait is designed so that the front and back legs 34 of one side plant and move simultaneously. The two sides alternate planting so that when the legs 34 on the left side are planted, the legs 34 on the right side are in the air, and vice versa. The middle leg 44 is positioned to support the robot 26 when the dynamic legs 34 are up by providing three points of contact—the middle leg 44 on one side and the dynamic legs 34 on the other.

Autonomous assembly is accomplished with embedded circuitry and an onboard power supply 32, as shown in FIGS. 25-27. Both assembly and locomotion are controlled by a single microcontroller 56 with the following six outputs: three binary outputs to control folding, and one binary and two pulse-width-modulation outputs to control the two motors 38. Folding is triggered by current that is gated by four MOSFETs 62. Locomotion is actuated through two motors 38, which are controlled by the microcontroller 56 via motor driver integrated circuits. The self-assembly process comprises the following five steps, as shown in FIGS. 7 and 15:

1. From 0-75 seconds, the outer legs 34 and dynamic linkages fold into position, and alignment tabs 36 fold into place.
2. At 85 seconds, the motors 38 turn 180° to align the crank arm pins 40 with the alignment tabs 36.
3. From 85-182 seconds, the body folds and the locking tabs 42 fold over the crank arm pins 40.
4. At 212 seconds, the motors 38 turn 180°, causing the robot 26 to stand up.
5. From 212-260 seconds, the middle legs 44 fold downward.

Self-assembly is programmed to occur ten seconds after power is connected to the circuit, and each step occurs at a preprogrammed time. After each folding step, 10-30 seconds were allowed to pass before the next step commenced to allow the hinges to cool and harden. Power is supplied from two batteries 32 with a nominal voltage of 7.4 V. The resistive circuits are voltage limited, so the resistance of each trace is adjusted to result in a current that falls between 2-2.5 A for desired heating. Voltage to the microcontroller 56 and motor drivers is controlled by two voltage regulators 60.

One strength of this technique is the speed of the development cycle. This robot design evolved through prototyping over 40 iterations. This number of iterations would have been prohibitively expensive using traditional machining techniques. Many limitations, such as minimum hinge size, trace width, and linkage lengths, were determined experimentally. The designs were produced using the design feature of the Solidworks computer-aided design software from Dassault Systemes SolidWorks Corporation of Waltham, Mass. Because these drawings are 2-D, they are easy to modify and compatible with a variety of computer-aided design programs, many of which are free.

One limitation of this technique is the substantial design time that is required. Currently, determining the appropriate fold patterns and hinge geometries takes several hours and some trial and error. However, the origami nature of this technique makes it tractable to consider design automation algorithms. Several programs have already been developed to aid in the design of folded structures and machines, as noted above.

Scalability:

The materials used here were selected because they are inexpensive and commercially available. They are capable of hinges as short as 5 mm and are well-suited for building structures and machines from 100 to 300 mm in length.

The primary challenge to folding larger structures is the weight of the folding faces, which is to be matched or exceeded by the torque exerted by the hinges. As the structure grows uniformly, the hinge torque grows as $O(L^3)$. However, the moment due to gravity is $O(L^4)$; so, as L increases, the moment due to gravity exceeds the hinge torque. The relationship between composite design and hinge torque is explored in S. Felton, et al., "Self-Folding with Shape Memory Composites," 9 Soft Matter 7688-7694 (2013); and we have created an analytical model to relate the maximum feature size with the uniaxial shape memory polymer recovery stress, $\sigma_r$, and thickness, $t_{smp}$. In this model, the shape memory polymer is constrained along both axes that are parallel with the composite at a strain of $\sigma_r$. The stress of the shape memory polymer in the hinge, $\sigma_h$, is equal in both of these axes and zero in the perpendicular axis (plane stress). Therefore, we can solve for $\sigma_h$ as a function of $\sigma_r$ in Eq. 1. We solve for the torque, r, exerted by the shape memory polymer in Eq. 2, and r exerted by gravity on the hinge face in Eq. 3. We use this value along with published examples of shape memory polymers to determine the maximum length, L, of a square folding face that a shape memory composite (SMC) incorporating that material can lift, as indicated in Table 2.

TABLE 2

| Material | Recovery stress (MPa) | Thickness (μm) | Maximum face length (m) |
|---|---|---|---|
| Polystyrene | 0.7 | 250 | 0.19 |
| Polystyrene | 0.7 | 500 | 0.24 |
| DiAPLEX (46) | 2 | 500 | 0.41 |
| Morthane with nanotubes (47) | 7 | 500 | 0.77 |
| Cross-linked HYPU (48) | 16 | 500 | 1.16 |
| Cross-linked PVAc-PLA (44) | 30 | 500 | 1.59 |

L is calculated by solving for the face length at which the torque exerted by gravity is equal to the torque exerted by the hinge, as shown in Eq. 4. By choosing the appropriate shape memory polymer, a maximum possible face length of 1.59 m is calculated. Other variables and values used in this model are given in Table 3.

TABLE 3

| Variable | Symbol | Value | Unit |
|---|---|---|---|
| Gravity acceleration | g | 9.8 | m/s$^2$ |
| SMP thickness | $t_{smp}$ | 250 | μm |
| SMP density | $\rho_{smp}$ | 1155 | kg/m$^3$ |
| SMP Poisson's ratio | ν | 0.5 | — |
| Paper thickness | $t_{paper}$ | 500 | μm |
| Paper density | $\rho_{paper}$ | 660 | kg/m$^3$ |
| Folding face length | L | — | M |
| Folding face mass | m | — | Kg |
| SMP Young's modulus | E | — | Pa |
| SMP recovery stress | $\sigma_r$ | — | Pa |
| SMP recovery strain | $\varepsilon_r$ | — | — |
| SMP hinge stress | $\sigma_h$ | — | Pa |
| Torque | τ | — | N-m |
| Hinge length | w | — | M |
| Force of gravity | F | — | N |
| Lever arm | d | — | M |

We have also used this model to calculate the combined torque of the hinges on the crawling robot 26. With a total hinge width of 688 mm, the hinges exerted a combined torque of 150 mNm during self-assembly.

$$\varepsilon_r = \frac{\sigma_r}{E} = \frac{1}{E}(\sigma_h - \nu\sigma_h) \tag{1}$$

$$\tau = \int_{t_{paper}}^{t_{paper}+t_{smp}} \sigma_h w t\, dt = (2\sigma_r) w \frac{(t_{paper}+t_{smp})^2 - t_{paper}^2}{2} \tag{2}$$

$$\tau = Fd = \text{mg}\left(\frac{L}{2}\right) = wL(2t_{smp}\rho_{smp} + 2t_{paper}\rho_{paper})\left(\frac{L}{2}\right) \tag{3}$$

$$L^2(t_{smp}\rho_{smp} + t_{paper}\rho_{paper}) = \sigma_r(t_{smp}^2 - 2t_{smp}t_{paper}) \tag{4}$$

At smaller sizes (e.g., 1-20 mm), the resolution is limited by fabrication methods and the composite thickness. The laser machining system that was used to build the self-folding robot has a spatial resolution of approximately 1 mm, based on the laser diameter and proximal warping of the material due to heat; and the masking process cannot reliably produce traces thinner than 0.3 mm. However, fabrication methods for producing complex functional laminates, known as PC-MEMS, have been demonstrated. Centimeter-long robots have already been built using these planar fabrication techniques [see P. S. Sreetharan, et al., "Monolithic Fabrication of Millimeter-Scale Machines," 22 J. Micromech Microeng. 055027 (2012) and U.S. Pat. No. 8,834,666 B2] with feature sizes smaller than one millimeter. Adapting these machining methods and materials to self-folding laminates is straightforward. Therefore, the methods presented in this work are suitable for creating machines over three orders of magnitude in characteristic dimensions—i.e., approximately one millimeter to one meter.

Comparison to 3-D Printing:

Self-assembly by folding draws comparisons to 3-D printing because of its applications as a form of printable manufacturing. In particular, we are interested in the relative cost and speed of manufacturing equivalent devices. For these comparisons, we consider a 3-D printed structure with a similar shape and size to the self-folding robot. Note, however, that self-assembly by folding integrates electronics naturally into the fabrication process, and this step is not included in the following estimates for 3-D printing.

The materials used in this robot 26 cost approximately $19, before the addition of motors, batteries, and other components. A 3-D printed structure of similar size would require 780 g of structural and support material, costing approximately the same, depending on the material and printer.

The primary strength of self-assembly by folding as compared to 3-D printing is speed of assembly. The above-described manufacturing process for the self-folding machine can be completed in less than two hours, and the folding process can be completed in four minutes. 3-D printing a structure of similar size and shape took 5 hours and 17 minutes with an Objet500 Connex 3-D printer in "high speed" mode, which was the fastest machine available to the present inventors. Many 3-D printers would take 10 or more hours. This speed would also be significantly slower if multiple materials were required, for instance if electrical traces were included in the printing process.

Energy Consumption:

The energy expended during assembly by the machine is the predominant factor in determining the size and type of batteries that are installed and carried. Note, however, that the energy necessary for folding is already stored in the shape memory polymer layer 12/14; and the energy expended by the batteries may only be needed to stimulate the phase transition. Consequently, there are two approaches to reducing the energy expenditure. The first is to alter the transition temperature of the shape memory polymer. A practical method for setting the transition temperature of an epoxy shape memory polymer anywhere from room temperature to 89° C. is demonstrated in T. Xie, et al., "Facile Tailoring of Thermal Transition Temperatures of Epoxy Shape Memory Polymers," 50 Polymer 1852-1856 (2009). While reducing the transition temperature of a self-folding machine would make the device more susceptible to premature assembly due to heat, this risk may be worth the substantial reduction in activation energy in many circumstances. Based on previously published models [see S. M. Felton, et al., "Self-Folding with Shape Memory Composites," 9 Soft Matter 7688-7694 (2013)], we estimate that if the transition temperature of the shape memory polymer used in this machine were reduced to 60° C., the activation current could be reduced by 70% and the energy expended during self-assembly reduced by 50%.

Alternatively, a larger current can be delivered at a higher voltage. While the larger current requires greater power, the reduction in folding time would reduce the total expended energy. Increasing the voltage and current by 40% would double the power but would reduce the fold time by 93% (i.e., resulting in an expected fold time of 3 seconds instead of 45 seconds), resulting in total energy expenditure of 86% less than the current implementation. The complication with this technique is that if the current is supplied for too long of a period, the shape memory polymer can overheat and melt. To reduce this risk, this method can be practiced with sensors embedded in the hinges to provide angle and temperature feedback during the folding process. As a consequence, the controller 56 would know when to switch off current to a folding hinge and would have the added benefit of producing more precise folds.

The size of the machine will also affect the power expended during self-assembly. For a given self-folding device, the energy released is relatively uniform along the length of the hinges. For a machine of a given complexity, the total length of the hinges will scale directly with the length of the machine, and so the energy consumed during assembly will also scale directly with machine length. Based on previous experiments, shape memory polymer thickness and hinge torque have little effect on power requirements, so the weight of the machine would have a minimal impact on energy consumption during assembly. However, more complex machines may require more folds and, therefore, more energy.

Shape memory polymers that are triggered by non-thermal stimuli that require less energy can also be used. There are several published examples of shape memory polymers that exhibit a shape change in response to water [see Y. Zhu, et al., "Rapidly Switchable Water-Sensitive Shape-Memory Cellulose/Elastomer Nano-Composites," 8 Soft Matter 2509-2517 (2012)], light [see A. Lendlein, et al., "Light-Induced Shape-Memory Polymers," 434 Nature 879-882 (2005)], magnetic fields [see J. M. Cuevas, et al., "Magneto-Active Shape Memory Composites by Incorporating Ferromagnetic Microparticles in a Thermo-Responsive Polyalkenamer," 18 Smart Mater. Struct. 075003 (2009)], or mechanical stress [see B. Heuwers, et al., "Stress-Induced Melting of Crystals in Natural Rubber: A New Way to Tailor the Transition Temperature of Shape Memory Polymers," 33 Macromol. Rapid Commun. 1517-1522 (2012)].

Adaptability:

The manufacturing process can be expanded with the development of printable batteries [see K. Sun, et al., "3D Printing of Interdigitated Li-Ion Microbattery Architectures," 25 Adv. Mat. 4539-4543 (2013)] and actuators, which can further improve manufacturing speed and customization. If the inclusion of a circuit layer is prohibitively expensive, but self-assembly is occurring in a dedicated facility, sequential activation can be accomplished via an external heater, such as a laser [see K. E. Laflin, et al, "Laser Triggered Sequential Folding of Microstructures," 101 Appl. Phys. Lett. 131901 (2012)]. For simpler geometries, a modified technique can be accomplished by heating the composite in an oven [see M. T. Tolley, et al., "Self-Folding Shape Memory Laminates for Automated Fabrication," 2013 IEEE International Conference on Intelligent Robots and Systems, Tokyo, Japan, 3-8 November 2013, 4931-4936]. For space applications, an embedded heating source may not be necessary. Black lines can be used to absorb thermal radiation from the sun along the hinges [see Y. Liu, et al., "Self-Folding of Polymer Sheets Using Local Light Absorption," 8 Soft Matter 1764-1769 (2012)]. For environments with large thermal variations, the transition temperature can be raised as high as 150° C., and shape memory polymers can be used that are triggered by non-thermal stimuli, such as those listed above.

Another option for self-folding composites is to integrate shape memory alloys (SMAs) as the contractile layer. Generally, SMAs have an actuated strain of less than 10%, making them ill-suited for use as the bimorph folding actuator. However, SMAs can exert stresses of up to 600 MPa, 20 times higher than the largest stress a shape memory polymer from Table 2 can exert. To achieve large fold angles, the hinge geometry can be modified so that small deflections in the contractile layer result in larger fold angles in the composite.

Repeatability:

Three self-folding robots 26 were constructed, and one achieved functionality. In the other two, a single hinge failed to fold into the intended position. In one robot 26, the locking tab 42 failed to align with the crank arm pin 40, preventing coupling. In the other, the locking tab 42 failed to fold at all, and the PSPS 12/14 in that area delaminated from the paper 16/18.

During these trials, the failed hinge was pushed into place manually so that the assembly process could finish to observe if there were other points of failure. Considering that each robot 26 consists of 28 hinges, the folding success rate is 97.6%.

Additional Embodiments

Additional embodiments of self-folding devices that can incorporate the inventions described herein are outlined in S. M. Felton, et al., "Self-folding with shape memory composites at the millimeter scale," 25 J. Micromech. Micreng. 085004 (2015).

In the above-discussed exemplifications, shape memory materials are used for actuation. In other embodiments, however, alternative folding methods and actuation mechanisms can be integrated into the device at or about the fold and used to fold the device. Examples of other means of actuation include pneumatic actuators, magnetic structures actuated by applied magnetic fields, electrostatics, differential stress, and polymer swelling. Various other types of contractile layers can be used, as well.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties or other values are specified herein for embodiments of the invention, those parameters or values can be adjusted up or down by 1/100th, 1/50th, 1/20th, 1/10th, 1/5th, 1/3rd, 1/2, 2/3rd, 3/4th, 4/5th, 9/10th, 19/20th, 49/50th, 99/100th, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

We claim:

1. A self-folding machine, comprising a laminate including:

a flexible layer with a first side and a second side;

a first rigid layer including at least one gap laminated to the first side of the flexible layer;

a second rigid layer including at least one gap laminated to the second side of the flexible layer, wherein the rigid layers are more rigid than the flexible layer;

a first contractible layer laminated to the first rigid layer and extending across at least one gap in the first rigid layer; and a second contractible layer laminated to the second rigid layer and extending across at least one gap in the second rigid layer, wherein the first and second contractible layers retract to respectively create folds in the machine across gaps in the first and second rigid layers when activated, wherein the contractible layers are shape-memory layers.

2. The self-folding machine of claim 1, wherein the laminate further comprises electrically conductive pathways electrically coupled with the first shape-memory layer and with the second shape-memory layer.

3. The self-folding machine of claim 2, further comprising a voltage source electrically coupled with the electrically conductive pathways.

4. The self-folding machine of claim 3, further comprising at least one motor coupled with the voltage source and including a mechanical actuator.

5. The self-folding machine of claim 4, wherein gaps in at least one of the rigid layers are configured to fold the laminate to position a portion of the laminate to be displaced by the mechanical actuator of the motor.

6. The self-folding machine of claim 5, wherein the actuator is a crank arm.

7. The self-folding machine of claim 5, wherein a plurality of legs in the laminate structure are configured to be displaced by the actuator to transport the machine across a surface.

8. The self-folding machine of claim 2, wherein the electrically conductive pathways are contained in or on the flexible layer.

9. The self-folding machine of claim 2, wherein at least one of the shape-memory layers includes a shape memory polymer.

10. The self-folding machine of claim 9, wherein the shape memory polymer comprises pre-stretched polystyrene.

11. The self-folding machine of claim 10, wherein the rigid layer comprises a composition selected from paper, fiber-reinforced epoxy, and a metal.

12. The self-folding machine of claim 2, further comprising slits or additional gaps defined in each of the first and second rigid layers, wherein the first shape-memory layer does not extend over the slits or additional gaps in the first rigid layer, wherein the second shape-memory layer does not extend over the slits or gaps in the second rigid layer, wherein the slits or additional gaps in the first rigid layer are aligned with gaps in the second rigid layer on an opposite side of the flexible layer, and wherein the slits or additional gaps in the second rigid layer are aligned with gaps in the first rigid layer on an opposite side of the flexible layer.

13. A method for self-folding a machine that includes a flexible layer with a first side and a second side; a first rigid layer including at least one gap laminated to the first side of the flexible layer; a second rigid layer including at least one gap laminated to the second side of the flexible layer, wherein the rigid layers are more rigid than the flexible layer; a first contractible layer laminated to the first rigid layer and extending across at least one gap in the first rigid layer; and a second contractible layer laminated to the second rigid layer and extending across at least one gap in the second rigid layer, wherein the first and second contractible layers retract to respectively create folds in the machine across gaps in the first and second rigid layers when activated, wherein the contractible layers are shape-memory layers, the method comprising:

actuating the first and second contractible layers to contract and fold the machine into a transformed three-dimensional structure.

14. The method of claim 13, wherein the machine further comprises an actuator, the method further comprising:

folding the laminated layers by retracting at least one of the first and second shape-memory layers to couple a portion of the machine with the actuator; and displacing the coupled portion of the machine via actuation of the actuator.

15. The method of claim 13, wherein the machine includes a voltage source and wherein the laminated layers include electrically conductive pathways, the method further comprising delivering a voltage from the voltage source through the electrically conductive pathways to the first and second shape-memory layers to fold the machine.

* * * * *